United States Patent
Yokoyama

(10) Patent No.: US 9,566,790 B2
(45) Date of Patent: Feb. 14, 2017

(54) METHOD OF FORMING STACKED WIRING

(71) Applicant: Seiko Epson Corporation, Tokyo (JP)

(72) Inventor: Yoshihiko Yokoyama, Chino (JP)

(73) Assignee: Seiko Epson Corporation (JP)

( * ) Notice: Subject to any disclaimer, the term of this patent is extended or adjusted under 35 U.S.C. 154(b) by 2 days.

(21) Appl. No.: 14/627,393

(22) Filed: Feb. 20, 2015

(65) Prior Publication Data
US 2015/0251426 A1 Sep. 10, 2015

(30) Foreign Application Priority Data
Mar. 6, 2014 (JP) .................. 2014-043606

(51) Int. Cl.
*H05K 3/06* (2006.01)
*B41J 2/16* (2006.01)
(Continued)

(52) U.S. Cl.
CPC ............. *B41J 2/1629* (2013.01); *B41J 2/1433* (2013.01); *B41J 2/14233* (2013.01); *B41J 2/161* (2013.01); *B41J 2/1607* (2013.01); *B41J 2/1623* (2013.01); *B41J 2/1631* (2013.01); *B41J 2/1643* (2013.01); *H05K 3/06* (2013.01); *H05K 3/061* (2013.01); *H05K 3/062* (2013.01); *H05K 3/064* (2013.01); *H05K 3/383* (2013.01); *H05K 3/384* (2013.01); *H05K 3/467* (2013.01);
(Continued)

(58) Field of Classification Search
CPC ..... B41J 2/14233; B41J 2/1433; B41J 2/1607; B41J 2/161; B41J 2/1623; B41J 2/1629; B41J 2/1631; B41J 2/1643; B41J 2002/14491; H05K 3/06; H05K 3/061; H05K 3/062; H05K 3/064; H05K 3/383; H05K 3/384; H05K 3/467; H05K 2201/0364; Y10T 29/49401
See application file for complete search history.

(56) References Cited

U.S. PATENT DOCUMENTS 4,602,261 A * 7/1986 Matsuda ................ B41J 2/1629
347/58
4,980,034 A * 12/1990 Volfson .................. H05K 3/467
205/122
(Continued)

FOREIGN PATENT DOCUMENTS

JP 2006-289943 A 10/2006
JP 2009006559 A * 1/2009

*Primary Examiner* — A. Dexter Tugbang
(74) *Attorney, Agent, or Firm* — Harness, Dickey & Pierce, P.L.C.

(57) ABSTRACT

A method of forming a stacked wiring includes forming a first adhesion layer on a substrate, forming a first wiring on the first adhesion layer, etching the first adhesion layer and the first wiring by the same first wet etching so that the first wiring is in a reverse trapezoid shape in which a first width of a top surface is larger than a second width of a bottom surface contacting the first adhesion layer as a cross-section in a direction intersecting with a first wiring extending direction, covering the top surface and a side surface of the first wiring with a second adhesion layer, forming a second wiring on the second adhesion layer, and etching the second adhesion layer and the second wiring by the same second wet etching so that the second adhesion layer and the second wiring remain on only the top surface of the first wiring.

3 Claims, 11 Drawing Sheets

(51) Int. Cl.
  *H05K 3/46*  (2006.01)
  *H05K 3/38*  (2006.01)
  *B41J 2/14*  (2006.01)

(52) U.S. Cl.
  CPC .............. *B41J 2002/14491* (2013.01); *H05K 2201/0364* (2013.01); *Y10T 29/49401* (2015.01)

(56) References Cited

U.S. PATENT DOCUMENTS 5,458,763 A * 10/1995 Kobayashi ............. H05K 3/062
                                                                205/104
2006/0164468 A1   7/2006 Yoda

* cited by examiner

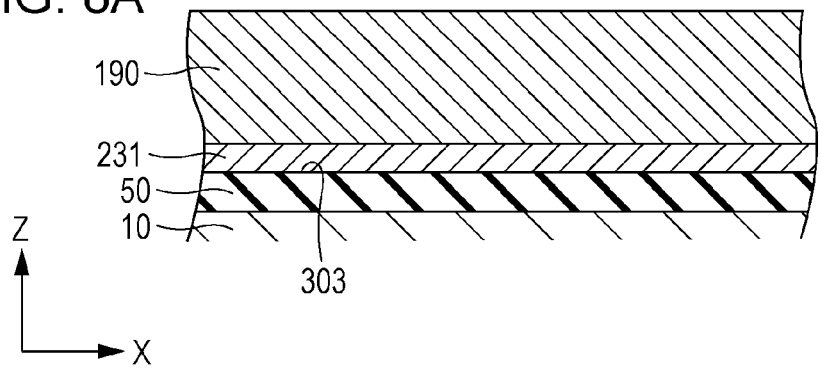
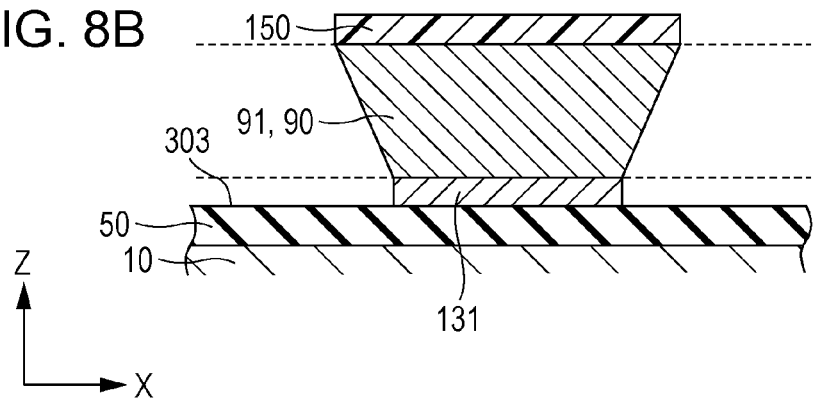
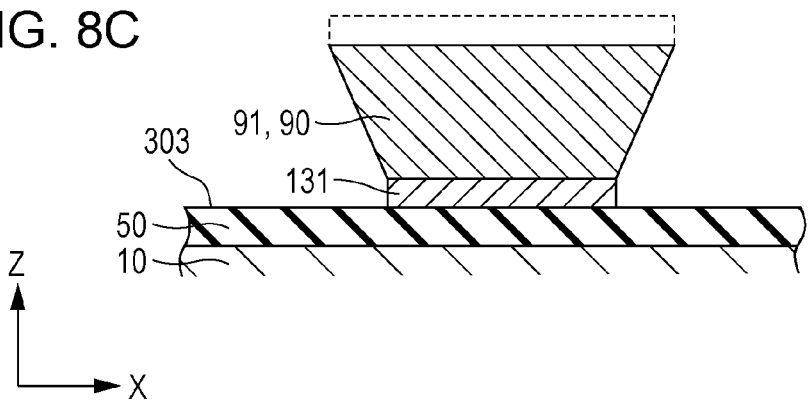

METHOD OF FORMING STACKED WIRING

BACKGROUND

1. Technical Field

The present invention relates to a method of forming a stacked wiring, a manufacturing method of a liquid ejecting head, a wiring mounting structure, a liquid ejecting head, and a liquid ejecting apparatus, and particularly relates to a method of forming a stacked wiring and a wiring mounting structure, a manufacturing method of the ink jet recording head, an ink jet recording head, and an ink jet recording apparatus which are used for an ink jet recording head ejecting ink as the liquid.

2. Related Art

As a liquid ejecting head which ejects liquid droplets, an ink jet recording head ejecting ink as an example of the liquid is known. The ink jet recording head is provided with a flow path forming substrate (a second substrate) on which a pressure generating chamber communicating with a nozzle opening is formed, a piezoelectric actuator provided on one surface of the flow path forming substrate, and a protective substrate (a first substrate) which is bonded to the piezoelectric actuator of the flow path forming substrate, and ejects the ink from the nozzle opening by causing the piezoelectric actuator to generate a pressure change in the liquid inside the pressure generating chamber.

In such an ink jet recording head, a driver IC (a semiconductor device) is provided on the surface opposite to the surface which is bonded to the flow path forming substrate of the protective substrate, a through hole is formed in the protective substrate, and a lead electrode (a first wiring) which is connected to the piezoelectric actuator is caused to be exposed to the through hole. The through hole is inclined with respect to a formation surface of the lead electrode. Then, by passing through a side wall in which the through hole is inclined, a wiring terminal of the driver IC and the lead electrode of the piezoelectric actuator are electrically connected to each other via an inclined wiring (a second wiring) (for example, refer to JP-A-2006-289943).

The lead electrode and the inclined wiring are, for example, formed as follows. First, an adhesion layer is provided on the flow path forming substrate and the lead electrode which is formed from metal such as gold is formed on the adhesion layer. Then, the lead electrode is covered with a protective layer which is formed from the same material as that of the adhesion layer. Next, the inclined wiring is formed on the protective layer on the lead electrode through a wet etching method.

However, there is a concern in that the adhesion layer is side-etched by an etchant when the inclined wiring is formed through the wet etching method. In this manner, when the adhesion layer is etched, there is a concern in that the lead electrode peels off from the flow path forming substrate, thereby resulting in a conduction failure between the lead electrode and the inclined wiring. In addition, there is a concern that the piezoelectric actuator corresponds to a portion in which a conduction failure occurs does not work even as the liquid ejecting head, thereby resulting in a poor ink ejection.

Meanwhile, such problems exist not only in a manufacturing method of the ink jet recording head but also in a manufacturing method of the liquid ejecting head, and exist in a method of forming a stacked wiring which is used for the liquid ejecting head and other devices as well. In addition, such problems exist not only in the ink jet recording head but also in the liquid ejecting head and the liquid ejecting apparatus which includes the liquid ejecting head, and exist in a wiring mounting structure which is used for the liquid ejecting head and other devices as well.

SUMMARY

An advantage of some aspects of the invention is to provide a method of forming a stacked wiring and a manufacturing method of a liquid ejecting head which is capable of suppressing peeling-off of a first wiring when forming a second wiring on the first wiring through a wet etching method. Further, the invention is to provide a wiring mounting structure, a liquid ejecting head, and a liquid ejecting apparatus of which the reliability is improved by suppressing the peeling-off of the first wiring on which the second wiring is formed through the wet etching method.

According to an aspect of the invention, there is provided a method of forming a stacked wiring including forming a first wiring, in which the width of the side opposite to a first adhesion layer is greater than the width of the first adhesion layer in a cross-sectional shape, on the first adhesion layer which is formed on a substrate and etched by an etchant; covering the first wiring with a second adhesion layer which is formed from the same material as that of the first adhesion layer; and forming a second wiring on the first wiring via the second adhesion layer through a wet etching method with the etchant.

In this case, it is possible to suppress the peeling-off of the first wiring from the substrate by preventing the first adhesion layer from being side-etched.

Here, it is preferable that a first layer be formed on the substrate with a material of the first adhesion layer, a second layer be formed on the first layer with a material of the first wiring, a resist pattern be formed on an area in which the first wiring of the second layer is formed, and the first wiring be formed, in which the width of the side opposite to the first adhesion layer is greater than the width of the first adhesion layer in the cross-sectional shape of the second layer by performing an over etching on the first layer and the second layer through the wet etching method. In this case, it is possible to easily form the first wiring having a reverse trapezoid shape without employing complicated steps by adjusting the time for performing the wet etching to be an over etching.

In addition, it is preferable that a first layer be formed on the substrate with a material of the first adhesion layer, a second layer be formed on the first layer with a material of the first wiring, a resist pattern which is formed by a photoresist method, includes a side surface which is inclined with respect to a surface of the substrate, and includes an opening portion extending toward a direction in which the width between the side surfaces facing each other is far from the second layer, be formed on the second layer so that an area corresponding to the first wiring of the second layer is exposed to the opening portion, a plating layer be formed with a material of the first wiring in the opening portion through a plating, and the first wiring be formed, in which the width of the side opposite to the first adhesion layer is greater than the width of the first adhesion layer in the cross-sectional shape by removing the resist pattern, and which is configured to include the second layer provided between the plating layer and the first layer, and the plating layer. In this case, it is possible to form an opening portion through a photoresist method with high precision, and thus it is possible to form the first wiring formed of a plating layer which is formed in the opening portion with high precision.

According to another aspect of the invention, there is provided a manufacturing method of a liquid ejecting head that includes a first substrate which includes a first main surface to which a semiconductor device is electrically connected, a second main surface which is a rear surface opposite to the first main surface, and an inclined surface which is provided between the first main surface and the second main surface, a second substrate which includes a third main surface which is connected to the second main surface of the first substrate, and a first wiring which is provided on the third main surface, and a second wiring which electrically connects the semiconductor device and the first wiring and is formed in series with the first wiring from the inclined surface, in which a flow path communicating with a nozzle opening which ejects a liquid and a pressure generating unit which causes the pressure change of the flow path are provided on the second substrate, and the pressure generating unit is driven by the semiconductor device, the method including forming the first wiring, in which the width of the side opposite to the first adhesion layer is greater than the width of the first adhesion layer in a cross-sectional shape, on the first adhesion layer which is formed on the second substrate and etched by an etchant; bonding the first substrate on the third main surface of the second substrate; covering the first wiring with a second adhesion layer formed from the same material as that of the first adhesion layer; and forming the second wiring on a portion from the inclined surface to the first wiring by the wet etching method with the etchant.

In this case, by suppressing the first adhesion layer from being side-etched, it is possible to prevent the first wiring from peeling off from the second substrate and to more reliably conduct the semiconductor device and the first wiring by the second wiring, thereby manufacturing the liquid ejecting head which ejects the liquid with high reliability.

According to still another aspect of the invention, there is provided a wiring mounting structure including a first wiring, in which the width of the side opposite to a first adhesion layer is greater than the width of the first adhesion layer in a cross-sectional shape, on the first adhesion layer which is formed on a substrate and etched by an etchant; and a second wiring which is formed on the first wiring through a wet etching method with the etchant, on the second adhesion layer which is formed from the same material as that of the first adhesion layer.

In this case, the highly reliable wiring mounting structure is provided, in which the first adhesion layer is prevented from being side-etched and the first wiring is prevented from peeling off from the substrate.

According to still another aspect of the invention, there is provided a liquid ejecting head including a first substrate which includes a first main surface to which a semiconductor device is electrically connected, a second main surface which is a rear surface opposite to the first main surface, and an inclined surface which is provided between the first main surface and the second main surface, a second substrate which includes a third main surface which is connected to the second main surface of the first substrate, and a first wiring which is provided on the third main surface, and a second wiring which electrically connects the semiconductor device and the first wiring and is formed in series with the first wiring from the inclined surface, in which a flow path communicating with a nozzle opening which ejects a liquid and a pressure generating unit which causes the pressure change of the flow path are provided on the second substrate, and the pressure generating unit is driven by the semiconductor device, in which the first wiring has the width of the side opposite to the first adhesion layer that is greater than the width of the first adhesion layer in a cross-sectional shape, on the first adhesion layer which is formed on the second substrate and etched by an etchant; and a in which second wiring is formed on a portion from the inclined surface to the first wiring through a wet etching method with the etchant, on the second adhesion layer which is formed from the same material as that of the first adhesion layer.

In this case, by preventing the first adhesion layer from being side-etched, it is possible to prevent the first wiring from peeling off from the second substrate and to more reliably conduct the semiconductor device and the first wiring by the second wiring, thereby providing the liquid ejecting head which ejects the liquid with high reliability.

According to still another aspect of the invention, there is provided a liquid ejecting apparatus including the liquid ejecting head of the aspect.

In this case, provided is the liquid ejecting apparatus of which the reliability is improved by suppressing the peeling-off of the first wiring on which the second wiring is formed through the wet etching method.

BRIEF DESCRIPTION OF THE DRAWINGS

The invention will be described with reference to the accompanying drawings, wherein like numbers reference like elements.

FIGS. 8A to 8C are cross-sectional views of stacked wirings according to the first embodiment.

DESCRIPTION OF EXEMPLARY EMBODIMENTS

First Embodiment

Hereinafter, the invention will be described in detail based on the embodiments. An ink jet recording head is an example of a liquid ejecting head and is simply referred to as a recording head.

Figure 1:
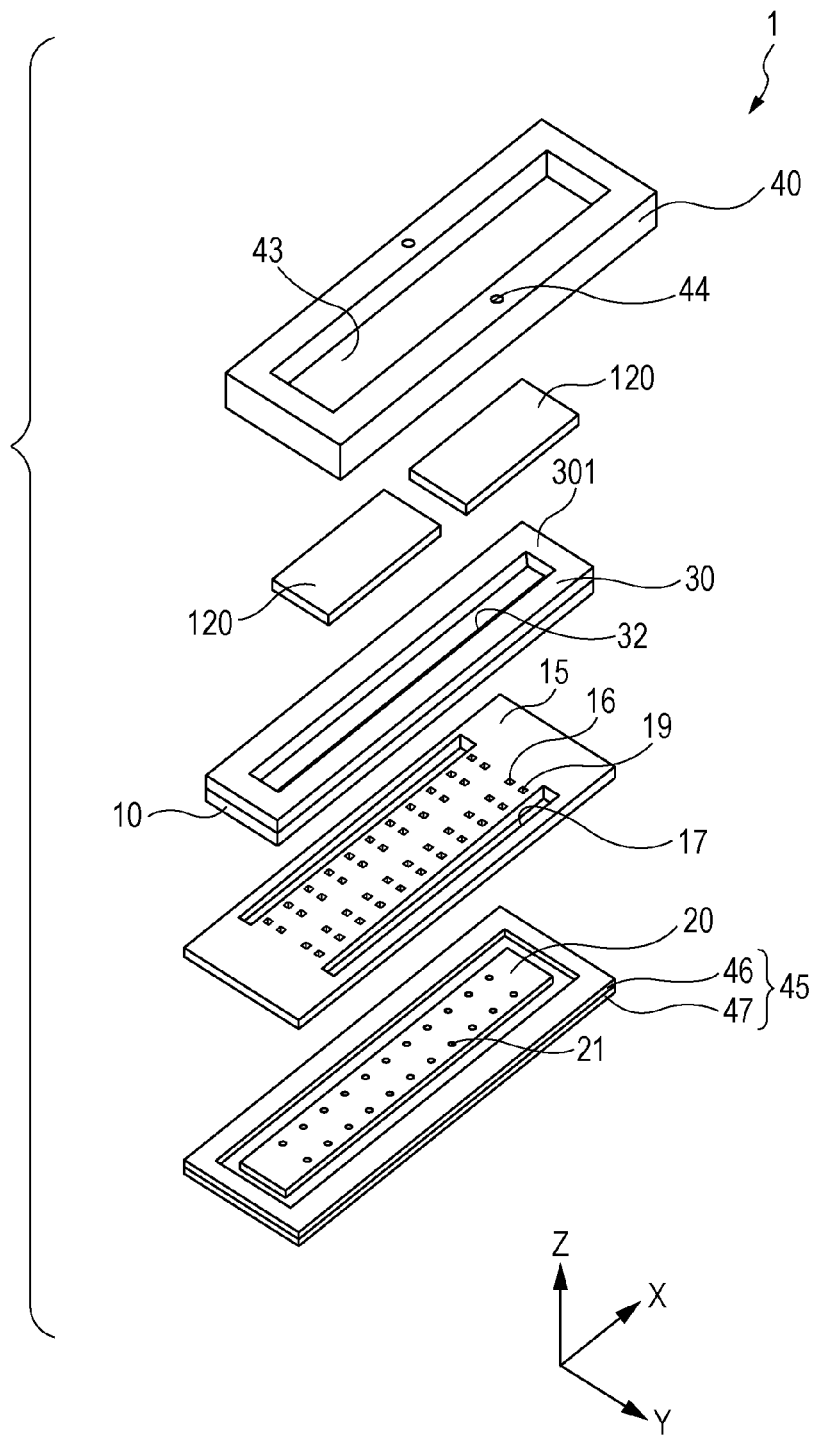
FIG. 1 is an exploded perspective view of a recording head according to a first embodiment.
Figure 2:
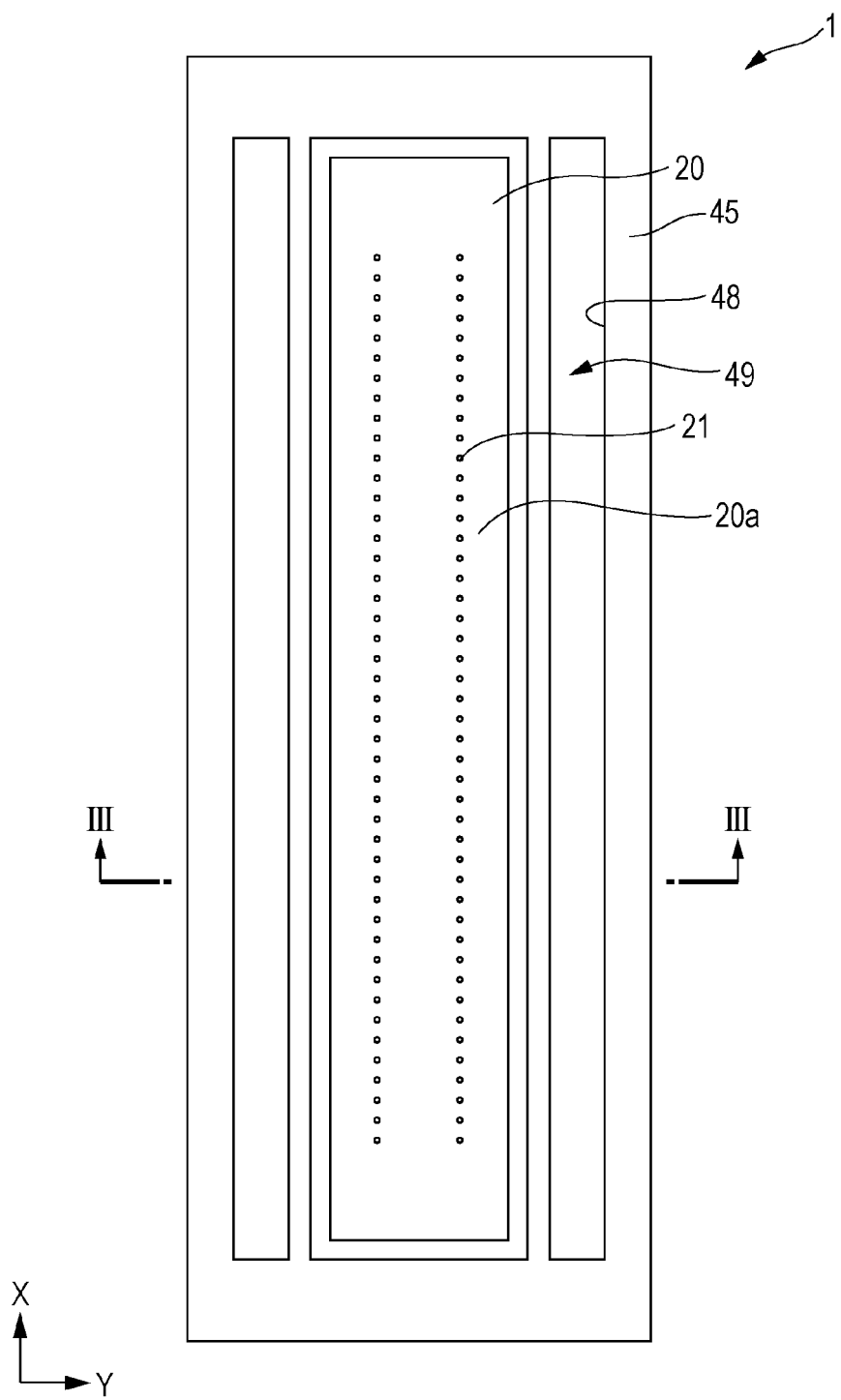
FIG. 2 is a plan view of the recording head according to the first embodiment.
Figure 3:
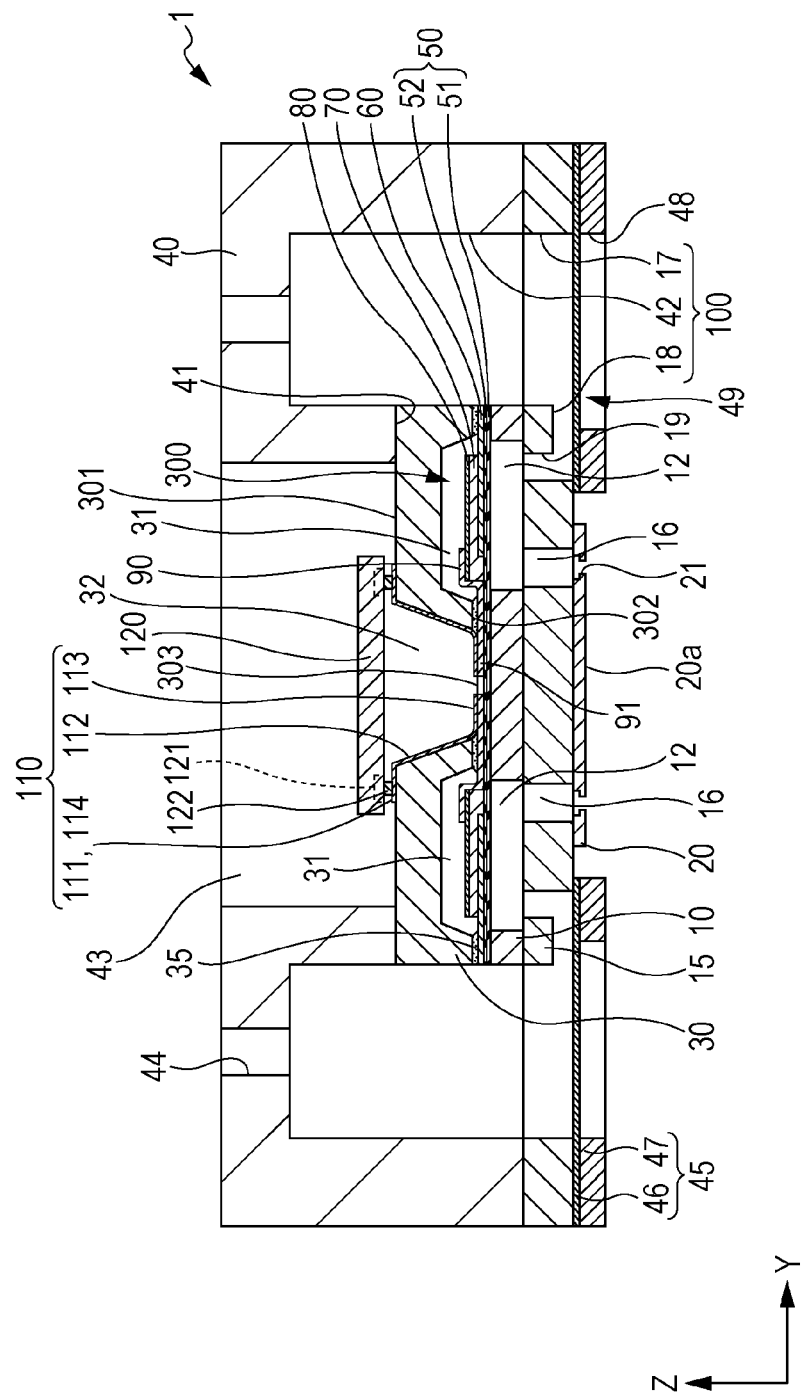
FIG. 3 is a cross-sectional view taken along line III-III in FIG. 2.
Figure 4:
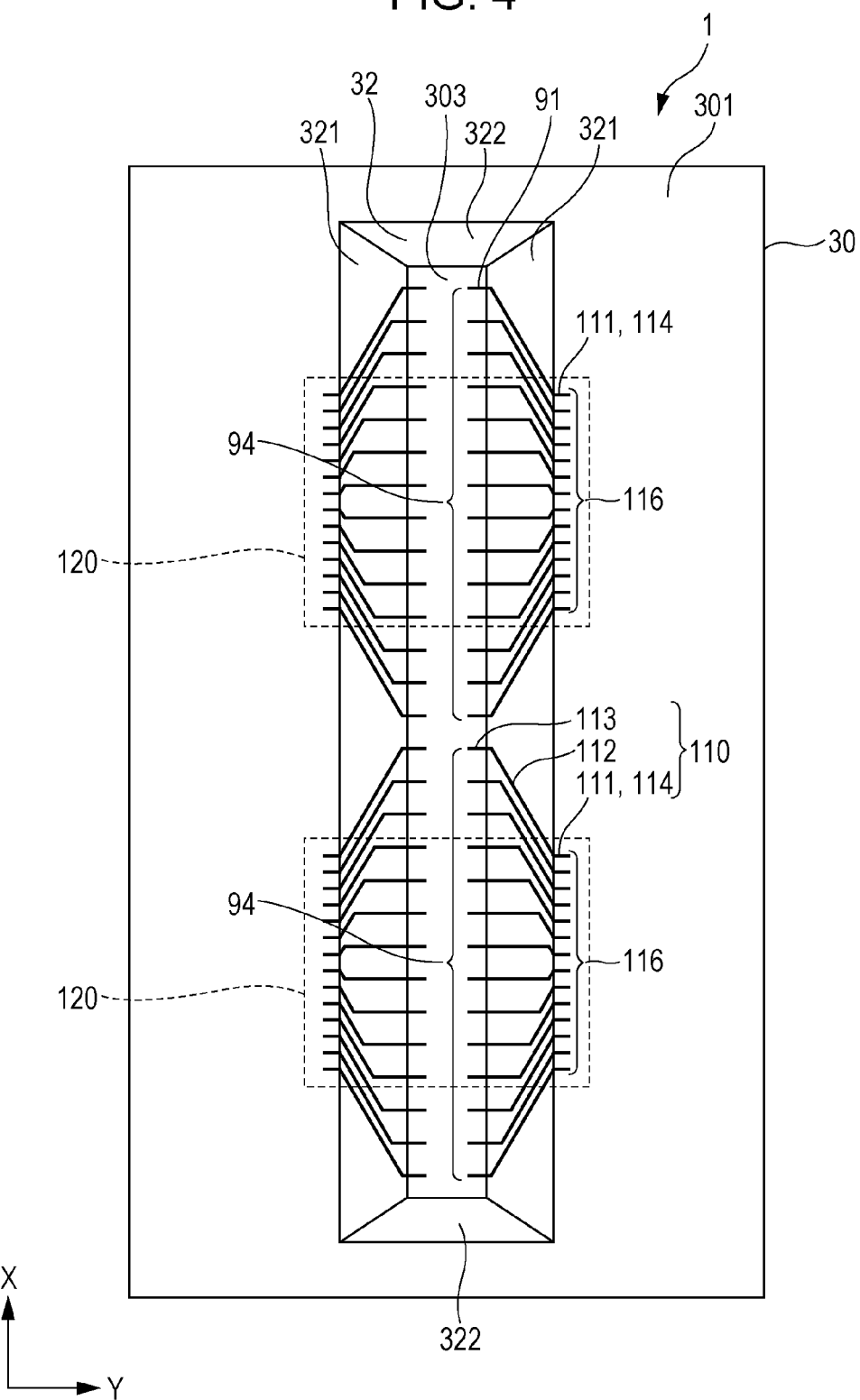
FIG. 4 is a plan view of a protective substrate according to the first embodiment.
Figure 5:
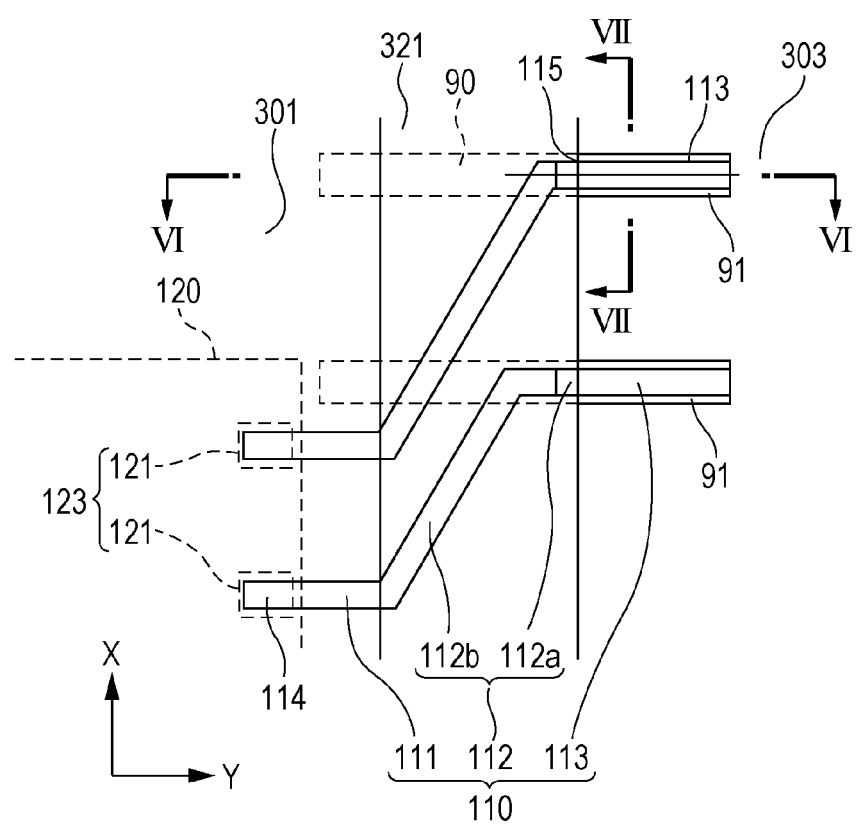
FIG. 5 is a plan view enlarging a main portion of the protective substrate in FIG. 4.

FIG. 1 is an exploded perspective view of a recording head according to a first embodiment, FIG. 2 is a plan view of the recording head according to the first embodiment, FIG. 3 is a cross-sectional view taken along line III-III in FIG. 2, FIG. 4 is a plan view of a protective substrate according to the first embodiment, and FIG. 5 is a plan view enlarging a main portion of the protective substrate in FIG. 4.

According to the embodiment, a recording head 1 includes a plurality of members such as a flow path forming substrate 10, a communicating substrate 15, a nozzle plate 20, a protective substrate 30, a compliance substrate 45, and a case member 40. In addition, the recording head 1 has a wiring mounting structure. The wiring mounting structure includes, as will be described in detail later, the protective substrate 30 as an example of a first substrate, a flow path forming substrate 10 as an example of a second substrate, a connection terminal 91 as an example of a first wiring, and an inclined wiring 110 as an example of a second wiring.

The flow path forming substrate 10 can be formed by using metal such as stainless steel or Ni, a ceramic material which is representative of $ZrO_2$ or $Al_2O_3$, a glass-ceramic material, an oxide such as MgO and $LaAlO_3$, or the like. In the embodiment, the flow path forming substrate 10 is formed from a silicon single crystal substrate. In the flow path forming substrate 10, a pressure generating chamber 12 which is divided into a plurality of partitions by performing of anisotropic etching from one surface side is provided in parallel along the direction in which a plurality of nozzle openings 21 which eject ink are provided in parallel. Hereinafter, this direction is referred to as a juxtaposed direction of the pressure generating chamber 12, or a first direction X. In addition, a plurality of rows in which the pressure generating chambers 12 are provided in parallel in the first direction X are provided in the flow path forming substrate 10, and two rows are provided in the embodiment. The direction in which the plurality of rows of pressure generating chamber 12 in which the pressure generating chamber 12 is provided in parallel along the first direction X is, hereinafter, referred to as a second direction Y. Further, the direction intersecting with the first direction X and the second direction Y is referred to as a third direction Z. Meanwhile, in the embodiment, for the sake of convenience of description, each direction (X, Y, and Z) is assumed to have an orthogonally crossing relationship, but it should be noted that the arrangement of the respective components is not intended to be necessarily limited to orthogonal.

In the flow path forming substrate 10, a supply path or the like, in which an opening area is smaller than that of the pressure generating chamber 12 and which imparts a flow path resistance of the ink flowing into the pressure generating chamber 12, may be provided on one end portion of the pressure generating chamber 12 in the second direction Y.

The communicating substrate 15 and the nozzle plate 20 are sequentially stacked on one surface of the flow path forming substrate 10 (the lamination direction, that is, direction −Z). That is, the recording head 1 is provided with the communicating substrate 15 which is provided on the one surface of the flow path forming substrate 10 and the nozzle plate 20 including the nozzle opening 21 which is provided on the surface opposite to the flow path forming substrate 10 of the communicating substrate 15.

A nozzle communication path 16 which communicates the pressure generating chamber 12 with the nozzle opening 21 is provided in the communicating substrate 15. The communicating substrate 15 has an area larger than the flow path forming substrate 10 and the nozzle plate 20 has an area smaller than the flow path forming substrate 10. In this manner, since the nozzle opening 21 of the nozzle plate 20 is separated from the pressure generating chamber 12 by providing the communicating substrate 15, the ink in the pressure generating chamber 12 is not easily affected by a viscosity of ink due to evaporation of water in the ink in the vicinity of the nozzle opening 21. In addition, the nozzle plate 20 may cover an opening of the nozzle communication path 16 which communicates the pressure generating chamber 12 with the nozzle opening 21, and thus it is possible to make the area of the nozzle plate 20 relatively small, thereby realizing a cost reduction. Meanwhile, in the embodiment, a surface of both surfaces of the nozzle plate 20, which discharges liquid droplets, that is, a surface on the side opposite to the pressure generating chamber 12, is referred to as a liquid ejecting surface 20a.

In addition, a first manifold portion 17 configuring a portion of a manifold 100 and a second manifold portion 18 (a diaphragm flow channel and an orifice flow channel) are provided in the communicating substrate 15.

The first manifold portion 17 is provided by penetrating the communicating substrate 15 in the thickness direction (lamination direction of the communicating substrate 15 and the flow path forming substrate 10).

The second manifold portion 18 is provided by opening to the nozzle plate 20 of the communicating substrate 15 penetrating the communicating substrate 15 in the thickness direction.

Further, a supply communication path 19 which communicates with one end portion of the pressure generating chamber 12 in the second direction Y is independently provided in the communicating substrate 15 for each pressure generating chamber 12. The supply communication path 19 communicates the second manifold portion 18 and the pressure generating chamber 12.

As the communicating substrate 15, metal such as stainless or Ni, or ceramic such as zirconium can be used. Meanwhile, it is preferable that the communicating substrate 15 be a material having the same linear expansion coefficients as those of the flow path forming substrate 10. That is, when the material having greatly different linear expansion coefficients from that of the flow path forming substrate 10 is used as the communicating substrate 15 and the material is heated and cooled, warpage is generated due to a difference in the linear expansion coefficients between the flow path forming substrate 10 and the communicating substrate 15. In the embodiment, it is possible to suppress warpage caused by heating or cooling and cracking, peeling-off, or the like caused by heat by using the same material as that of the flow path forming substrate 10, as the communicating substrate 15, that is, a silicon single crystal substrate.

In the nozzle plate 20, the nozzle opening 21 which communicates with each of the pressure generating chambers 12 via the nozzle communication path 16 is formed. Such a nozzle opening 21 is provided in parallel in the first direction X, and the row in which the nozzle openings 21 are provided in parallel in the first direction X is formed of two rows in the second direction Y.

As the nozzle plate 20, for example, metal such as stainless steel (SUS), an organic material such as a polyimide resin, the silicon single crystal substrate, or the like can be used. Note that, the nozzle plate 20 and the communicating substrate 15 have the same linear expansion coefficients by using the silicon single crystal substrate as the nozzle plate 20, and thus it is possible to suppress the warpage caused by heating or cooling and the cracking, the peeling-off, or the like caused by heat.

On the other hand, a vibrating plate 50 is formed on the surface opposite to the communicating substrate 15 of the flow path forming substrate 10. In the embodiment, as the vibrating plate 50, there are provided an elastic film 51 which is formed from the silicon oxide and provided on the flow path forming substrate 10, and an insulating film 52 which is formed from the zirconium oxide and provided on the elastic film 51. Meanwhile, the liquid flow path such as the pressure generating chamber 12 is formed by performing the anisotropic etching on the flow path forming substrate 10 (the surface bonded to the nozzle plate 20) from one surface, and the other surface of the liquid flow path such as the pressure generating chamber 12 is defined by the elastic film 51.

A piezoelectric actuator 300 which is a pressure generating unit of the embodiment and includes a first electrode 60, a piezoelectric layer 70, and a second electrode 80 is provided on the vibrating plate 50 of the flow path forming substrate 10. Here, the piezoelectric actuator 300 means a portion including the first electrode 60, the piezoelectric layer 70, and the second electrode 80. Generally, the piezoelectric actuator 300 is configured to have one electrode which is assumed to be a common electrode and the other electrode which is patterned for each pressure generating chamber 12. In the embodiment, the first electrode 60 is assumed to be the common electrode by being successively provided over the plurality of piezoelectric actuators 300, and the second electrode 80 is assumed to be an individual electrode by being independently provided for each piezoelectric actuator 300. Of course, there is no problem even in being reversed for the convenience of a drive circuit or wiring. Meanwhile, in the above described examples, the vibrating plate 50 which is formed of the elastic film 51 and the insulating film 52 is exemplified; however, the vibrating plate 50 is not limited, for example, the vibrating plate 50 may be formed of either of the elastic film 51 and the insulating film 52, and only the first electrode 60 may serve as the vibrating plate without providing the elastic film 51 and the insulating film 52 as the vibrating plate 50. In addition, the piezoelectric actuator 300 may substantially serve as the vibrating plate.

The piezoelectric layer 70 is formed from a piezoelectric material of an oxide which has a polarization structure formed on the first electrode 60. For example, the piezoelectric layer 70 can be formed from a perovskite type oxide expressed in the general formula $ABO_3$, and it is possible to use a lead based piezoelectric material including lead or a non-lead based piezoelectric material not including lead.

An end of a lead electrode 90 which is a lead-out wiring is connected to each of the first electrode 60 and the second electrode 80 of the piezoelectric actuator 300. The other end portion of the lead electrode 90 is led out on the vibrating plate 50, that is, between rows of the piezoelectric actuator 300 which are adjacent to each other in the second direction Y. Here, the other end portion of the lead electrode 90 which is led out becomes a connection terminal 91 which is an example of the first wiring connected to a drive circuit 120 which is a semiconductor device (will be described later in detail). In the embodiment, a connection terminal row, in which the connection terminal 91 is provided in parallel in the first direction X which is the standard direction of the embodiment, is formed for each row of the piezoelectric actuator 300. That is, the connection terminal row in which the connection terminal 91 is configured to be provided in parallel in the first direction X is provided with two rows in parallel in the second direction Y.

Further, the flow path forming substrate 10 on which the lead electrode 90 including the connection terminal 91 is provided corresponds to the second substrate, and a surface of the protective substrate 30 of the flow path forming substrate 10, that is, a surface of the protective substrate 30 of the vibrating plate 50, is referred to as a third main surface 303.

The protective substrate 30 which has substantially the same size as the flow path forming substrate 10 is bonded to the surface of the piezoelectric actuator 300 of the flow path forming substrate 10. In the embodiment, the protective substrate 30 corresponds to the first substrate, a surface on the side opposite to a surface which is bonded to the flow path forming substrate 10 of the protective substrate 30 is referred to as a first main surface 301, and a surface which is bonded to the flow path forming substrate 10 is referred to as a second main surface 302. That is, a third main surface 303 of the flow path forming substrate 10 which is the second substrate is bonded to the second main surface 302 of the first substrate.

As the protective substrate 30, a material having substantially the same coefficient of thermal expansion as that of the flow path forming substrate 10, for example, glass, the ceramic material, or the like, is preferably used, and in the embodiment, the protective substrate 30 is formed by using the silicon single crystal substrate having the same material as that of the flow path forming substrate 10. In addition, a method of bonding the flow path forming substrate 10 and the protective substrate 30 is not particularly limited, and for example, the flow path forming substrate 10 and the protective substrate 30 are bonded to each other via an adhesive 35 in the embodiment.

The protective substrate 30 includes a holding portion 31 on the second main surface 302, which is a space for protecting and accommodating the piezoelectric actuator 300. The holding portion 31 is formed in a concave shape so as to open to the flow path forming substrate 10 without penetrating the protective substrate 30 in the thickness direction which is the third direction Z. In addition, in the embodiment, the holding portion 31 is independently provided for each row of the piezoelectric actuator 300 which is provided in parallel in the first direction X. In other words, the holding portion 31 is successively provided over the rows in which the piezoelectric actuator 300 is provided in parallel in the first direction X for each row of the piezoelectric actuator 300, that is, two rows are provided in parallel in the second direction Y. The holding portion 31 may have a space large enough not to hinder the movement of the piezoelectric actuator 300 and the space may be sealed or may not be sealed.

The protective substrate 30 includes a through hole 32 penetrating in the third direction Z which is the thickness direction. The through hole 32 is successively provided in the first direction X which is the juxtaposed direction of the plurality of piezoelectric actuators 300 between two holding portions 31 which are provided in parallel in the second direction Y. In other words, the through hole 32 is regarded as the opening having a long side in the juxtaposed direction of the plurality of piezoelectric actuators 300.

First side wall portions 321 which are wall surfaces of both sides of the through hole 32 in the second direction Y are in an inclined surface formed by being inclined between the first main surface 301 and the second main surface 302. That is, the first side wall portion 321 which is in the inclined surface extends in the first direction X. The first side wall portion 321 is in the inclined surface, which means that it is provided to be inclined with respect to the first main surface 301 and the second main surface 302. That is, the first side wall portion 321 is not parallel to the first main surface 301 and the second main surface 302, and is not parallel with the third direction Z which is orthogonal to the first main surface 301 and the second main surface 302. In other words, the first side wall portion 321 is provided to be inclined with respect to the third direction Z. Although an inclination angle of the inclined surface is not particularly limited, in a case where the protective substrate 30 is formed by using the silicon single crystal substrate, depending on the surface orientation of the silicon single crystal substrate, the angle of the first side wall portion 321 is, for example, 54.7° with respect to the second main surface 302. In addition, an interval of two first side wall portions 321 which face each other in the second direction Y extend toward the direction which is far from the flow path forming substrate 10 in the third direction Z.

Meanwhile, in the embodiment, two second side wall portions 322 which are wall surfaces of both sides of the through hole 32 in the first direction X are formed by being inclined with respect to the first main surface 301 and the second main surface 302 similar to the first side wall portion 321. In this manner, by providing the first side wall portion 321 and the second side wall portion 322 to be inclined, it is possible to easily form the through hole 32 through, for example, the etching method, with high precision.

In the protective substrate 30, a portion of the third main surface 303 (a portion of the vibrating plate 50) of the flow path forming substrate (the second substrate) 10 is exposed inside the through hole 32, and the connection terminal 91, which is an end portion of the lead electrode 90 led out from the piezoelectric actuator 300, is provided to be exposed to the above exposed area.

Specifically, a portion, which is led out to the area inside the through hole 32 of the lead electrode 90 to be exposed, is the connection terminal 91. On the third main surface 303 of the flow path forming substrate 10, a group consisting of a plurality of connection terminals 91 which are provided in parallel in the first direction X is referred to as a connection terminal row 94. In the embodiment, in the portion which is exposed to the through hole 32 of the third main surface 303 (an area inside the through hole 32), two connection terminal rows 94 are provided in parallel in the second direction Y.

Further, a drive circuit 120 which is the semiconductor device is mounted on the first main surface 301 of the protective substrate 30. In the embodiment, the drive circuit 120 is disposed to face the first main surface 301 of the protective substrate 30 so as to cover and then block a portion of the through hole 32. That is, in the drive circuit 120, the width in the second direction Y is greater than the through hole 32, and the through hole 32 is disposed over the second direction Y. Such a drive circuit 120 is provided with two rows in parallel in the first direction X.

In the drive circuit 120, a terminal 121 is provided on the surface of the protective substrate 30. The plurality of terminals 121 are provided corresponding to each of the piezoelectric actuators 300, and are provided in parallel in the first direction X so as to form a terminal row 123 (refer to FIG. 5). In the embodiment, in the drive circuit 120, two terminal rows 123 are provided in parallel in the second direction Y.

The inclined wiring 110 is formed in the protective substrate 30, which is an example of the second wiring electrically connecting the drive circuit 120 and the connection terminal 91 (the lead electrode 90) which is an example of the first wiring.

Specifically, the inclined wiring 110 is provided with a first wiring portion 111 which is provided on the first main surface 301, an inclined wiring portion 112 which is formed on the first side wall portion 321 in series with the first wiring portion 111, and a second wiring portion 113 which is formed on the connection terminal 91 in series with the inclined wiring portion 112.

One end portion of the first wiring portion 111 becomes a wiring terminal 114 which is electrically connected to the terminal 121 of the drive circuit 120. On the first main surface 301, a group consisting of a plurality of wiring terminals 114 which are provided in parallel in the first direction X is referred to as a wiring terminal row 116. In the embodiment, on the first main surface 301, each of the wiring terminal rows 116 is provided on the both sides of the through hole 32 in the second direction Y.

The plurality of inclined wirings 110 are provided for each combination of the terminal 121 of the drive circuit 120 and the connection terminal 91. That is, in each of the inclined wirings 110, the wiring terminal 114 is electrically connected to the terminal 121 of the drive circuit 120 and the second wiring portion 113 is electrically connected to the connection terminal 91. With the inclined wiring 110, the drive circuit 120 is electrically connected to the connection terminal 91.

The terminal 121 of the drive circuit 120 is provided with a connection portion 122 which is a metal bump. The connection portion 122 and the wiring terminal 114 are reliably electrically connected to each other by being crimped via welding such as with a solder connection, an aerotropic conductive adhesive (ACP and ACF), an aerotropic conductive adhesive (NCP and NCF), or the like.

A case member 40 which forms the manifold 100 communicating the plurality of pressure generating chamber 12 is fixed to a bonded body of the above described flow path forming substrate 10, the protective substrate 30, the communicating substrate 15, and the nozzle plate 20. The case member 40 has substantially the same shape as the aforementioned communicating substrate 15 in a planar view and is bonded to not only the protective substrate 30 but also the aforementioned communicating substrate 15. Specifically, the case member 40 includes a concave portion 41 on the protective substrate 30, which has a depth enough to accommodate the flow path forming substrate 10 and the protective substrate 30. The concave portion 41 has an opening area greater than the surface bonded to the flow path forming substrate 10 of the protective substrate 30. Then, the opening surface of the nozzle plate 20 of the concave portion 41 is sealed by the communicating substrate 15 in a state where the flow path forming substrate 10 or the like is accommodated in the concave portion 41. In this manner, the third manifold portion 42 is defined between the flow path forming substrate 10 and the protective substrate 30, and the case member 40. In addition, the manifold 100 of the embodiment is configured to have a first manifold portion 17 and a second manifold portion 18 which are provided in the communicating substrate 15, and a third manifold portion 42 which is defined by the case member 40.

Meanwhile, as the material of the case member 40, for example, resin, metal, or the like can be used. Incidentally, mass-production at low cost can be realized by forming a resin material as the case member 40.

In addition, the first manifold portion 17 and the second manifold portion 18 are open to a surface of the communicating substrate 15, and the compliance substrate 45 is provided on the surface. This compliance substrate 45 seals the opening of the liquid ejecting surface 20a of the first manifold portion 17 and the second manifold portion 18. The compliance substrate 45 is provided with a sealing film 46 and a fixing substrate 47 in the embodiment. The sealing film 46 is formed by using a thin film having flexibility (for example, the thin film having the thickness of 20 µm or less, which is formed from polyphenylene sulfide (PPS) or stainless steel (SUS)), and the fixing substrate 47 is formed by using a hard material, for example, metal such as stainless steel (SUS). An area facing the manifold 100 of the fixing substrate 47 becomes an opening portion 48 which is completely removed in the thickness direction, and thus one surface of the manifold 100 becomes a compliance portion 49 which is a flexible portion sealed only by the sealing film 46 having flexibility.

Meanwhile, an introducing path 44 for supplying the ink to each manifold 100 by communicating with the manifold 100 is provided in the case member 40. In addition, a connection port 43, which causes the first main surface 301 of the protective substrate 30 to be exposed and accommodated in the drive circuit 120, is provided in the case member 40. A signal and power for driving the drive circuit 120 are supplied from the outside via the wiring which is used to electrically connect the drive circuit 120 in the connection port 43 to a flexible substrate or the like when the flexible substrate or the like is inserted into the connection port 43 to be mounted therein, or the wiring (not shown) which is formed on the protective substrate 30.

In the recording head 1 with such a configuration, when ejecting the ink, the inside of the flow path from the manifold 100 to the nozzle opening 21 is filled with ink by taking ink from a liquid storage unit that stores the ink via the introducing path 44. Thereafter, according to a signal from the drive circuit 120, the piezoelectric actuator 300 and the vibrating plate 50 are deflected by applying a voltage to the piezoelectric actuator 300 which corresponds to the pressure generating chamber 12. For this reason, the pressure inside the pressure generating chamber 12 is increased, and thus ink droplets from a predetermined nozzle opening 21 are ejected.

Figure 6:
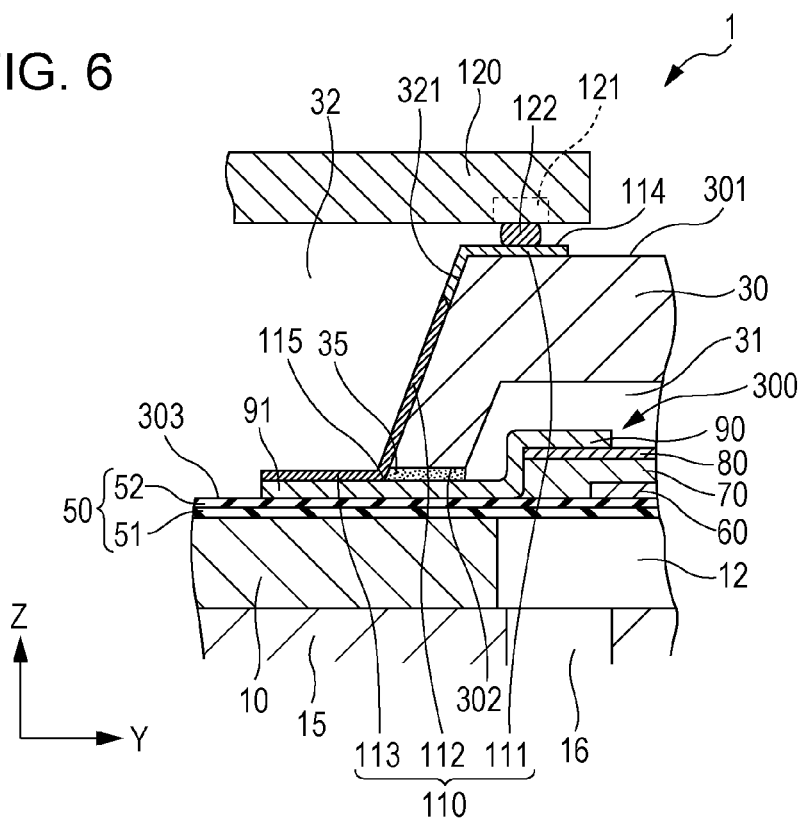
FIG. 6 is a cross-sectional view taken along line VI-VI in FIG. 5.
Figure 7:
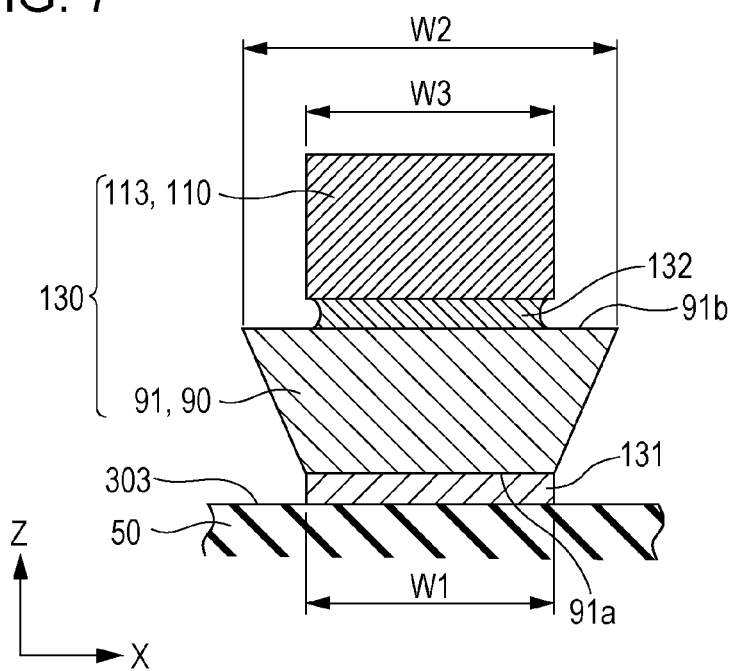
FIG. 7 is a cross-sectional view taken along line VII-VII in FIG. 5.

Here, with reference to FIG. 5 to FIG. 7, description of a stacked wiring 130 in which the connection terminal 91 which is an example of the first wiring and the inclined wiring 110 which is an example of the second wiring are stacked will be made in detail. FIG. 6 is a cross-sectional view taken along line VI-VI in FIG. 5 and FIG. 7 is a cross-sectional view taken along line VII-VII in FIG. 5.

A first adhesion layer 131 is formed in the vibrating plate 50 of the flow path forming substrate 10, that is, between the third main surface 303 and the connection terminal 91. In the embodiment, the first adhesion layer 131 is formed between the entire lead electrode 90 including the connection terminal 91 and the third main surface 303.

The first adhesion layer 131 is formed from a material to be etched by the etchant. The etchant is used when the inclined wiring 110 described later is formed through the wet etching method.

In addition, the first adhesion layer 131 has conductivity and is formed from a material which enhances the adhesion between the third main surface 303 and the connection terminal 91 (the lead electrode 90). For example, when the connection terminal 91 is formed from gold, nickel, an alloy of nickel and chromium (chromium), or the like can be used as the material the first adhesion layer 131.

It is possible to enhance the adhesion between the third main surface 303 and the connection terminal 91 (the lead electrode 90) by providing the first adhesion layer 131.

The connection terminal 91 which is an example of the first wiring is provided on an upper surface of the first adhesion layer 131 (the surface opposite to the third main surface 303). In the embodiment, the lead electrode 90 including the connection terminal 91 is provided on the first adhesion layer 131 except for a portion connected to the piezoelectric actuator 300. Hereinafter, a shape of the connection terminal 91 will be described, and the lead electrode 90 including the connection terminal 91 has the same shape as that of the connection terminal 91.

As illustrated in FIG. 7, in the cross-sectional shape of the connection terminal 91, a width W2 which is on the side opposite to the first adhesion layer 131 is greater than a width W1 of the first adhesion layer 131. The cross-sectional shape of the connection terminal 91 referred to herein is the cross-sectional shape in the direction intersecting with the direction in which the connection terminal 91 extends. The cross-sectional shape of the connection terminal 91 in the embodiment is the cross-sectional shape parallel to the direction X intersecting with direction Y (refer to FIG. 5) in which the connection terminal 91 extends.

In addition, the width of the first adhesion layer 131 means the width W1 of a lower surface 91a of the lower surface 91a facing the third main surface 303 and an upper surface 91b facing the surface opposite to the third main surface 303 in the cross-sectional shape of the connection terminal 91. The width on the side opposite to the first adhesion layer 131 means the width W2 of the upper surface 91b.

According to the embodiment, the connection terminal 91 is formed into a reverse trapezoid shape in which the width is enlarged from the lower surface 91a to the upper surface 91b. In addition, the connection terminal 91 is formed from a material having conductivity, for example, gold, and is formed through the wet etching method. A manufacturing method of the connection terminal 91 will be described later.

A second adhesion layer 132 is formed between the upper surface 91b of the connection terminal 91 and the inclined wiring 110. In the embodiment, the second adhesion layer 132 is formed between the upper surface 91b of the connection terminal 91 and the second wiring portion 113 which is a portion of the inclined wiring 110.

Similar to the first adhesion layer 131, the second adhesion layer 132 is formed from a material to be etched by the etchant. In addition, as will be described in detail later, when the inclined wiring 110 is formed through the wet etching method, the second adhesion layer 132 is provided in order to protect the connection terminal 91 which is formed before forming the inclined wiring 110 from the etchant. That is, the second adhesion layer 132 is formed so as to cover the entire connection terminal 91, and then etched through the wet etching method, and the remainder between the connection terminal 91 and the inclined wiring 110 becomes the second adhesion layer 132.

In addition, the second adhesion layer 132 is formed from a material which has conductivity and enhances the adhesion between the connection terminal 91 and the inclined wiring 110. For example, when the inclined wiring 110 is formed from gold, nickel, an alloy of nickel and chromium (chromium), or the like can be used as the material of the second adhesion layer 132.

It is possible to enhance the adhesion between the connection terminal 91 and the inclined wiring 110 by providing the second adhesion layer 132.

The inclined wiring 110 is provided on the second adhesion layer 132. As described above, the inclined wiring 110 is configured to have the first wiring portion 111, the inclined wiring portion 112, and the second wiring portion 113.

On the first main surface 301, the first wiring portion 111 is provided in parallel in the first direction X on both sides of the through hole 32 in the second direction Y. In the embodiment, the first wiring portion 111 linearly extends in the second direction Y. One end portion of the first wiring portion 111 becomes the wiring terminal 114 and is electrically connected to the connection portion 122 of the drive circuit 120. The first wiring portion 111 is provided in parallel in the first direction X at a pitch smaller than that of the connection terminal 91.

Of the lead electrode 90, the second wiring portion 113 is provided on the second adhesion layer 132 of the upper surface 91b of the connection terminal 91, which is a portion derived and then exposed to the through hole 32. The upper surface of the connection terminal 91 means a surface opposite to the flow path forming substrate 10 with respect to the connection terminal 91. The second wiring portion 113 linearly extends in the second direction Y. The pitch of the second wiring portion 113 in the first direction X is the same as that of the lead electrode 90 in the first direction X.

The inclined wiring portion 112 is formed so as to connect the first wiring portion 111 and the second wiring portion 113. In other words, the inclined wiring portion 112 electrically connects the wiring terminal 114 and the connection terminal 91 of the lead electrode 90.

In the embodiment, the inclined wiring portion 112 is provided with a linear portion 112a which is provided in the second wiring portion 113 (on the first side wall portion 321 which is the inclined surface, an end portion of a boundary portion 115 between the first side wall portion 321 and the third main surface 303 when the third main surface 303 is seen from a planar view), and an inclined portion 112b which is provided in the first wiring portion 111 in series with the linear portion 112a. The linear portion 112a linearly extends along the second direction Y. In addition, the inclined portion 112b linearly extends to be inclined with respect to the linear portion 112a.

A gap between the linear portions 112a which are adjacent to each other in the first direction X, that is, the gap between the connection terminals 91, is different from the gap between the wiring terminals 114 which are adjacent to each other in the first direction X. That is, the gap (pitch) between the terminals 121 which configure the terminal row 123 in the first direction X is smaller than the gap (pitch) between the connection terminals 91 which configure the connection terminal row 94 in the first direction X.

In the embodiment, the entirety of the inclined portion 112b of the inclined wiring portion 112 is formed at the same inclination angle. The inclination angle referred to herein is an angle with respect to the first direction X and the second direction Y in a planar view in FIG. 5. Accordingly, the inclined wiring 110 can electrically connect each of the connection terminals 91 to the wiring terminal 114 by adjusting the length of the linear portion 112a in the second direction Y. In other words, the inclined wiring 110 can connect each of the terminals 121 (the connection portion 122) to the connection terminal 91 regarding the terminal row (metal bump row) 123 and the connection terminal row 94 which have the gap different from each other (metal bump row).

The first wiring portion 111, the second wiring portion 113, and the inclined wiring portion 112 are formed with the same width in the embodiment. Therefore, it is possible to suppress an increase in the resistance of the inclined wiring 110 and suppress the wiring in the connection portion between the first wiring portion 111, the second wiring portion 113, and the inclined wiring portion 112. It is needless to say that the first wiring portion 111, the second wiring portion 113, and the inclined wiring portion 112 which configure the inclined wiring 110 may be formed with the same width.

In addition, a width W3 of the second wiring portion 113 of the inclined wiring 110 is smaller than the width W2 of the upper surface 91b of the connection terminal 91, but the size of the width is not limited. The width W3 may be equal to or greater than the width W2.

As described above, the stacked wiring 130 according to the embodiment is provided with the connection terminal 91 which is provided on the third main surface 303 of the flow path forming substrate 10 via the first adhesion layer 131 and the inclined wiring 110 which is provided on the connection terminal 91 via the second adhesion layer 132.

The inclined wiring 110 is formed through the wet etching method and the second adhesion layer 132 is formed at the same time. In a case where the inclined wiring 110 and the second adhesion layer 132 are subjected to the wet etching, the width of the first adhesion layer 131 is suppressed to become smaller the W1 due to the side etching.

In other words, the first adhesion layer 131 has the same width as that of the lower surface 91a of the connection terminal 91 and causes the entirety of lower surface 91a of the connection terminal 91 to adhere to the third main surface 303. Accordingly, the connection terminal 91 is prevented from peeling off from the third main surface 303, and the stacked wiring 130 can electrically connect the drive circuit 120 and the piezoelectric actuator 300 more reliably. Therefore, in the wiring mounting structure including the stacked wiring 130, it is possible to improve the reliability by electrical connecting the drive circuit 120 and the piezoelectric actuator 300 more reliably. Then, in the recording head 1, it is possible to improve the reliability by electrical connecting the drive circuit 120 and the piezoelectric actuator 300 more reliably, thus suppressing malfunction of the piezoelectric actuator.

Incidentally, in the related art, when the first adhesion layer 131 is under the wet etching, the side etching is performed at the same time, thereby being smaller than the lower surface 91a of the connection terminal 91. That is, both ends of the connection terminal 91 in the direction X are not adhered to the first adhesion layer 131 and are not bonded to the third main surface 303. As a result, the connection terminal 91 easily peels off from the third main surface, and the stacked wiring 130 cannot maintain the electrical connection between the drive circuit 120 and the piezoelectric actuator 300.

Note that the width of the first adhesion layer 131 is not necessarily the same as the width W1 of the lower surface 91a of the connection terminal 91, and may be greater than the width W1. In addition, the side surface of the second adhesion layer 132 is slightly side-etched, but it is possible to ignore a decrease in the adhesion since the bonding of the connection terminal 91 and the inclined wiring 110 is the bonding of metal and metal.

Hereinafter, the description of a manufacturing method of the stacked wiring and a manufacturing method of the recording head according to the embodiment will be made with reference to FIG. 8A to FIG. 10B. FIG. 8A to FIG. 10B are cross-sectional views of the stacked wiring including the connection terminal 91 and the inclined wiring 110. Meanwhile, the illustration for the manufacturing process of the recording head other than the stacked wiring will not be made.

First, for example, an oxide film configuring the elastic film is formed on the surface of the flow path forming substrate 10 which is formed from a silicon monocrystal. For example, the oxide film is formed from a silicon dioxide by performing thermal oxidation on the surface of the flow path forming substrate 10. Next, an insulating film is formed by using the oxide film formed from a different material from that of the elastic film on the elastic film (the oxide film). Specifically, for example, a zirconium (Zr) layer is formed through a spattering method on the elastic film (the oxide film) and then the insulating film formed from a zirconium oxide ($ZrO_2$) is formed by performing the thermal oxidation on the zirconium layer.

Next, for example, the first electrode film is formed by stacking platinum and iridium on the insulating film and thereafter, the first electrode film is patterned into a predetermined shape. Next, for example, a piezoelectric layer which is formed from lead zirconate titanate (PZT) or the like, and a second electrode film which is formed from, for example, iridium (Ir), are formed and then these piezoelectric layer and second electrode film are patterned to form a piezoelectric actuator.

As the material of the piezoelectric layer, it is possible to use, for example, a ferroelectric material having a piezoelectric property such as lead zirconate titanate (PZT) or a relaxor ferroelectric obtained by adding the metal such as niobium, nickel, magnesium, bismuth, or yttrium to the ferroelectric material having the piezoelectric property. In addition, a method of forming the piezoelectric layer in the embodiment is a so-called sol-gel method, and the method is as follows. A so-called sol which is obtained by dissolving and dispersing a metal organic material in a solvent is coated and dried to make a gel, and then sintered at a high temperature, thereby obtaining the piezoelectric layer formed from the metal the oxide. Meanwhile, the method of forming the piezoelectric layer is not particularly limited, and an MOD method, the sputtering method, or the like may be used.

Next, the first adhesion layer 131 and the connection terminal 91 are formed. Specifically, as illustrated in FIG. 8A, the first layer 231 which is formed from, for example, nichrome, is formed over the entirety of vibrating plate 50 on the flow path forming substrate 10. The first layer 231 is formed from the material of the first adhesion layer 131. Further, the second layer 190 which is formed from, for example, gold, is formed on the first layer 231. The second layer 190 is formed from the material of the connection terminal 91. As will be described later, the connection terminal 91 is formed by performing the wet etching on the second layer 190, and the first layer 231 is also formed from the material to be etched by the etchant used in the wet etching method.

Next, as illustrated in FIG. 8B, a resist pattern 150 is formed on the area in which the connection terminal 91 (the lead electrode 90) of the second layer 190 for each piezoelectric actuator is formed. Then, the wet etching is performed on the first layer 231 and the second layer 190. At this time, the time to be immersed in the etchant or the like is adjusted so as to perform the over etching. The over etching referred to herein means a state in which the first layer 231 and the second layer 190 are etched in the width so as to be smaller than the width of the resist pattern 150 (the width in the direction X and direction Y in a planar view).

As described above, the first layer 231 and the second layer 190 are formed from a material to be etched with respect to the etchant, and thus the resist pattern 150 is removed except for the third main surface 303 side and thereby the connection terminal 91 and the first adhesion layer 131 are formed. By performing the over etching, the second layer 190 is etched to the inside from the resist pattern 150 and the connection terminal 91 (the lead electrode 90) which is formed into the reverse trapezoid shape is formed. In addition, the first layer 231 is removed except for the area which is bonded to the connection terminal 91, and is insulated from the adjacent connection terminal 91.

In this manner, according to the method of forming stacked wiring according to the embodiment, by adjusting the time performing the wet etching, it is possible to easily form the connection terminal 91 which is formed into the reverse trapezoid shape without employing complicated procedures.

Figure 9A:
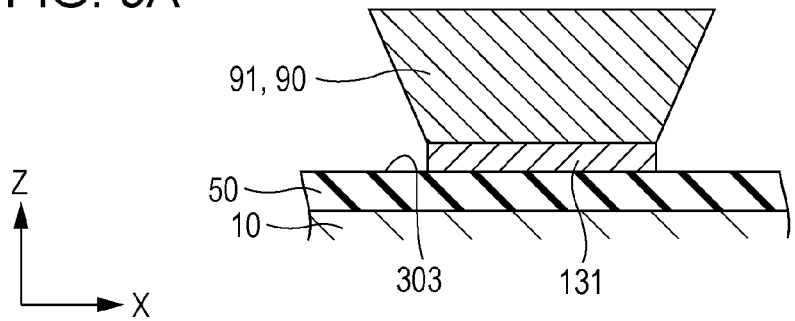
FIGS. 9A to 9C are cross-sectional views of stacked wirings according to the first embodiment.

Next, as illustrated in FIG. 8C, by removing the resist pattern 150, the connection terminal 91 which is formed into the reverse trapezoid shape is formed on the first adhesion layer 131, as illustrated in FIG. 9A.

Next, although not shown particularly, the protective substrate 30 is bonded onto the third main surface 303 of the flow path forming substrate 10 by using the adhesive 35 (refer to FIG. 6). Meanwhile, the holding portion 31 and the through hole 32 are formed in advance in the protective substrate 30. Accordingly, in the through hole 32 of the protective substrate 30, a portion of the lead electrode 90 is derived and then exposed to the through hole 32. The portion of the lead electrode 90 which is exposed to the through hole 32 corresponds to the connection terminal 91.

Figure 9B:
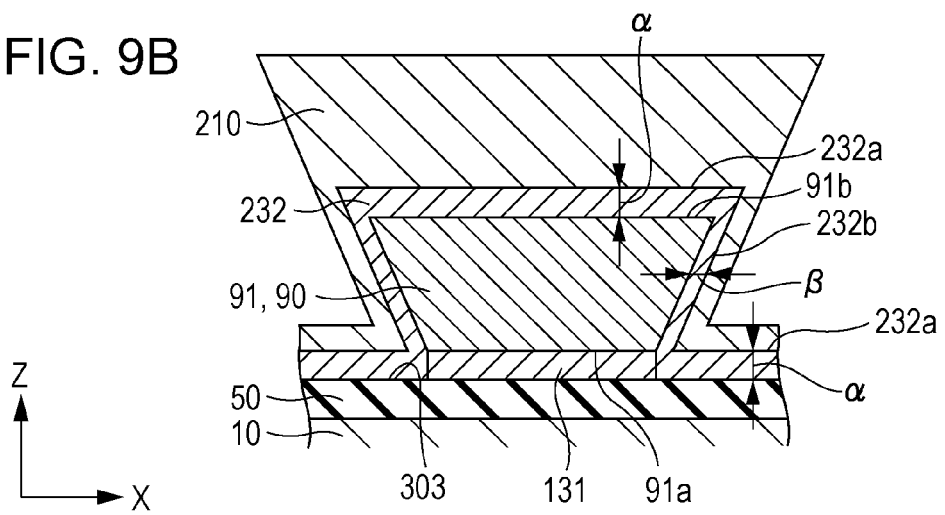

Next, the second adhesion layer 132 which is formed from the same material as that of the first adhesion layer 131 is formed, and further, the inclined wiring 110 is formed on the second adhesion layer 132. Specifically, as illustrated in FIG. 9B, the third layer 232 which is formed from the same material as that of the first adhesion layer 131 and corresponds to the second adhesion layer 132 is formed on the first main surface 301 of the protective substrate 30 (refer to FIG. 6) and the first side wall portion 321 and the upper surface of the connection terminal 91. In the embodiment, third layer 232 is formed so as to cover the third main surface 303 and the connection terminal 91 which are exposed to the through hole 32. In addition, the third layer 232 is also formed over the entire surface of the first main surface 301 and the first side wall portion 321.

The third layer 232 corresponds to the second adhesion layer 132 between the connection terminal 91 and the inclined wiring 110, and functions as the protective film which covers the entire connection terminal 91 in the manufacturing process. That is, the third layer 232 serves to protect the connection terminal 91 from being etched when the inclined wiring 110 is formed through the wet etching method.

In addition, the third layer 232 which is formed from nichrome is formed through the spattering method in the embodiment. At this time, in the connection terminal 91, the cross-sectional shape becomes the reverse trapezoid type, and thus the third layer 232 is not easily formed on the side surface of the connection terminal 91 through the spattering method. That is, in the third layer 232, the film thickness of the surface parallel with the third main surface 303 is different from the surface intersecting with the third main surface 303.

A portion of the third layer 232 which is provided on the third main surface 303 and the upper surface 91b of the connection terminal 91 is assumed to be a planar portion 232a, and a portion of the third layer 232 which is provided on the side surface of the connection terminal 91 is assumed to be the side surface portion 232b. If the film thickness of the planar portion 232a is assumed to be $\alpha$ and the film thickness of the side surface portion 232b is assumed to be $\beta$, the film thickness $\alpha$ is thicker than the film thickness $\beta$.

Then, a fourth layer 210 corresponding to the inclined wiring 110 is additionally formed on the third layer 232. The fourth layer 210 which is formed from the material capable of being wet-etched, for example, gold, in the embodiment is formed through the spattering method. In the embodiment, the fourth layer 210 is formed so as to cover the entire third layer 232.

Figure 9C:
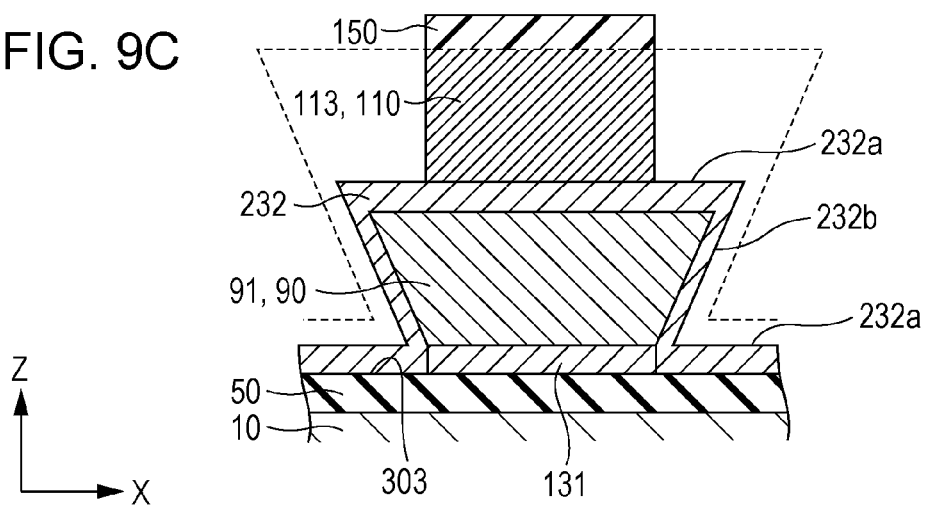

Next, as illustrated in FIG. 9C, the resist pattern 150 is formed on the area in which the inclined wiring 110 of the fourth layer 210 is formed. Then, the inclined wiring 110 is formed by performing the wet etching on the fourth layer 210. FIGS. 9A to 9C illustrate a state in which the wet etching is performed on the fourth layer 210 until the third layer 232 is exposed.

Figure 10A:
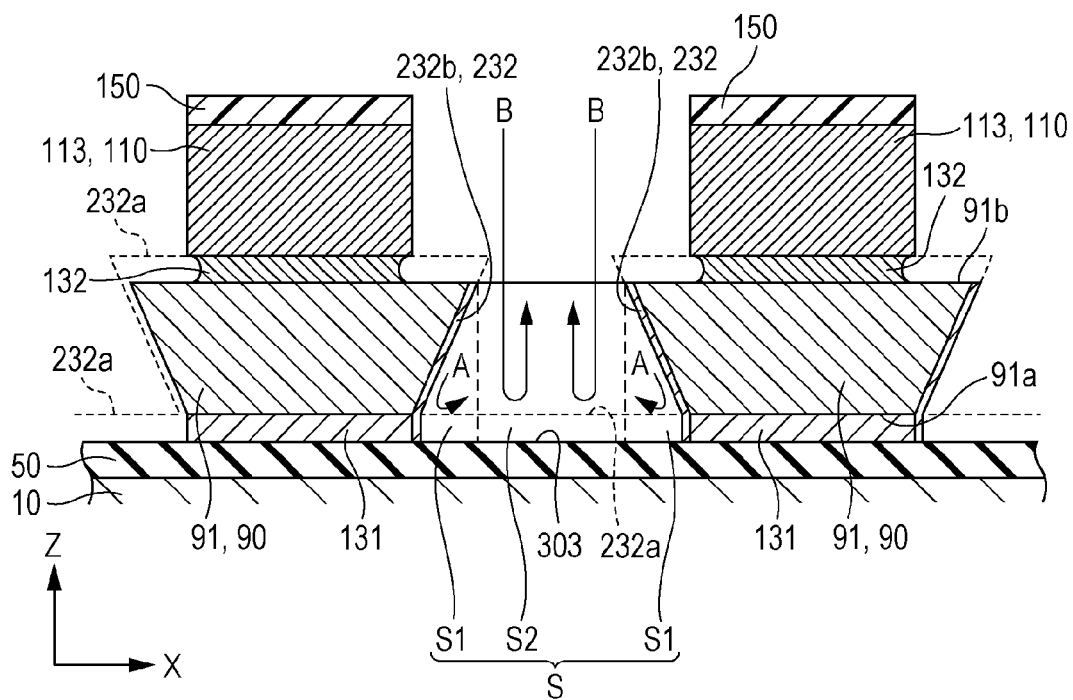
FIGS. 10A and 10B are cross-sectional views of stacked wirings according to the first embodiment.

Next, as illustrated in FIG. 10A, the wet etching is performed on the third layer 232 by using the same type of the etchant which is used when the wet etching is performed on the fourth layer 210.

Here, a space between the adjacent side surface portions 232b which faces the connection terminal 91 is assumed to be a space portion S. In the space portion S, a portion on the side of the third main surface 303 along the direction Z from the side surface portion 232b is assumed to be a first space portion S1. In the space portion S, a portion other than the first space portion S1, that is, a portion which is opened to the side opposite to the third main surface 303 in the direction Z, is assumed to be a second space portion S2.

Since each connection terminal 91 is formed into the reverse trapezoid shape as described above, the third main surface 303 and the side surface portion 232b are close to each other in the first space portion S1 which is smaller than the second space portion S2.

Accordingly, the etchant does not easily flow in the first space portion S1; for example, there is a tendency that the etchant remains in the first space portion S1 as indicated by arrow A. On the other hand, since the second space portion S2 is opened to the side opposite to the third main surface 303 in the direction Z, the etchant easily flows; for example, there is a tendency that the etchant is circulated as indicated by arrow B.

For this reason, since the etchant does not easily flow in the first space portion S1, the etching rate of the side surface portion 232b becomes relatively low. On the other hand, since the etchant easily flows in the vicinity of the second space portion S2 and the upper surface 91b of the connection terminal 91, the etching rate of the planar portion 232a becomes relatively high.

In this manner, since the etching rate is low in the first space portion S1 facing the side surface portion 232b, it is possible to leave the side surface portion 232b even when the planar portion 232a is removed. That is, the side surface portion 232b functions as the protective film which protects the first adhesion layer 131 from being etched. For this reason, it is possible to suppress a state in which the etchant reaches the first adhesion layer 131 and thus, the first adhesion layer 131 is side-etched.

As described above, the connection terminal 91 is formed into the reverse trapezoid type, the inclined wiring 110 is formed in the aforementioned connection terminal 91 through the wet etching method, and thus it is possible to set the second adhesion layer 132 by leaving a portion between the connection terminal 91 and the inclined wiring 110 in the third layer 232, and to insulate the adjacent first adhesion layers 131 and the adjacent connection terminals 91 from each other by removing the third layer 232 which is provided on the third main surface 303.

Incidentally, if a state where the planar portion 232a which is a portion of the third layer 232 on the third main surface 303 is formed is maintained, each of the first adhesion layers 131 and each of the connection terminals 91 are conducted. Since the planar portion 232a formed on the third main surface 303 insulates the adjacent first adhesion layers 131 from each other, it is necessary to remove the planar portion 232a.

According to the method of forming the stacked wiring of the embodiment, it is possible to reliably insulate between the adjacent first adhesion layers 131 and prevent the first adhesion layer 131 from being side-etched by removing the planar portion 232a on the third main surface 303 which is a portion of the third layer 232.

By preventing the first adhesion layer 131 from being side-etched, it is possible to prevent the connection terminal 91 from peeling off from the third main surface 303 and to more reliably conduct the drive circuit 120 and the piezoelectric actuator 300, thereby manufacturing the recording head 1 which ejects ink with high reliability.

Figure 10B:
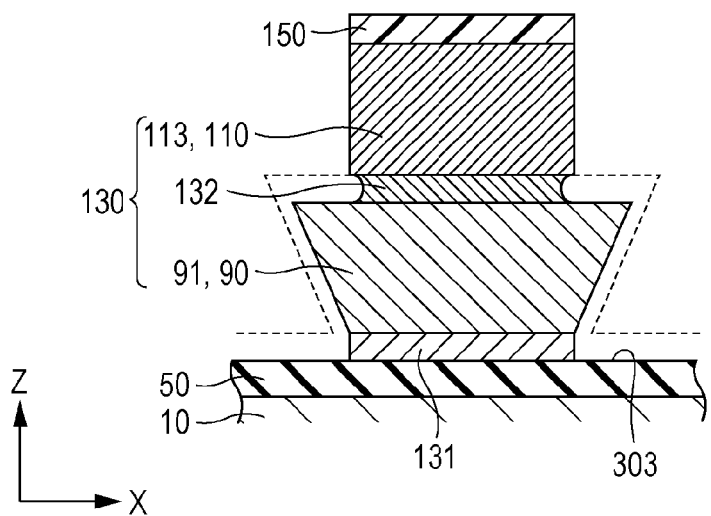

As described above, in the third layer 232, the etching rate of the planar portion 232a is different from that of the side surface portion 232b, and the film thickness α of the planar portion 232a is greater than the film thickness β of the side surface portion 232b. That is, while the etching rate is different, since the film thickness α is greater than the film thickness β, it is possible to prevent the times required for respectively removing the planar portion 232a and the side surface portion 232b from being greatly different from each other. Accordingly, as illustrated in FIG. 10A, when removing the planar portion 232a, the side surface portion 232b slightly remains, but as illustrated in FIG. 10B, it is possible to remove the planar portion 232a and the side surface portion 232b almost at the same time.

Incidentally, if the connection terminal 91 which is formed into the cross-sectional shape is not the reverse trapezoid shape but, for example, is formed into the rectangular shape, there is almost no difference between the etching rates with respect to the planar portion 232a and the side surface portion 232b. Therefore, there is a concern in that as the film thickness of the side surface portion 232b which is formed on the side surface of the connection terminal 91 through the spattering method is thin, the side surface portion 232b is quickly removed and thus the first adhesion layer 131 is exposed. For this reason, the side etching is performed on the first adhesion layer 131.

Hereinafter, although not shown particularly, it is possible to form the stacked wiring 130 by removing the resist pattern 150.

Then, the thickness of the flow path forming substrate 10 is set to a predetermined thickness by processing a surface opposite to the third main surface 303 of the flow path forming substrate 10. Next, a predetermined pattern of the protective film which is used as a mask in forming the pressure generating chamber 12 is formed on the surface opposite to the third main surface 303 of the flow path forming substrate 10. That is, the protective film which includes the opening portion is formed in the area facing the pressure generating chamber 12. Next, the aforementioned protective film is set to be a mask and the anisotropic etching (the wet etching) is performed on the flow path forming substrate 10. Accordingly, the pressure generating chamber 12 is formed on the flow path forming substrate 10.

Further, the communicating substrate 15 is bonded to the surface opposite to the third main surface 303 of the flow path forming substrate 10. In the communicating substrate 15, the nozzle communication path 16, the first manifold portion 17, the second manifold portion 18, and the supply communication path 19 are formed in advance. The communicating substrate 15 is bonded to the flow path forming substrate 10 by communicating the nozzle communication path 16 and the supply communication path 19 with the pressure generating chamber 12.

In addition, the nozzle plate 20 having the nozzle opening 21 provided thereon is bonded to a surface opposite to the flow path forming substrate 10 of the communicating substrate 15 so that the nozzle opening communicates with the nozzle communication path 16.

Next, the compliance substrate 45 is bonded to the surface opposite to the flow path forming substrate 10 of the communicating substrate 15. At this time, the sealing film 46 is configured to block the first manifold portion 17 and the second manifold portion 18 of the communicating substrate 15.

Next, the drive circuit 120 is placed on the first main surface 301 of the protective substrate 30 and the wiring terminal 114 and the connection portion 122 are electrically connected to each other. In addition, it is possible to manufacture the recording head 1 by adhering the case member 40 which includes the concave portion 41 and the third manifold portion 42 to the protective substrate 30 and the communicating substrate 15 by using the adhesive or the like in advance.

Meanwhile, the protective substrate 30 and the flow path forming substrate 10 are described as examples in the embodiment, but the example is not particularly limited. For example, the plurality of protective substrates 30 are integrally formed on one sheet of wafer and the plurality of flow path forming substrates 10 are integrally formed on one sheet of wafer, and then two wafers are bonded to each other, and thereafter may be divided into the size of the cross-sectional view as shown in FIG. 3.

Further, in the recording head 1 according to the embodiment, the drive circuit 120 is disposed over the through hole 32 in the second direction Y. That is, in a planar view (refer to FIG. 4), it is possible to set the area in which the through hole 32 exists to be a space for disposing the drive circuit 120. Therefore, in the first main surface 301 of the protective substrate 30, it is possible to reduce the space for disposing the drive circuit 120, thereby realizing miniaturization of the recording head 1 in the planar direction.

In addition, since the drive circuit 120 is disposed over the through hole 32 in the second direction Y, it is possible to reinforce the protective substrate 30 of which the rigidity is deteriorated by the through hole 32 through the drive circuit 120.

Furthermore, the width in which two drive circuits 120 occupy in the first direction X is smaller than the through hole 32. That is, in the first direction X, the through hole 32 communicates with the outside via both sides of drive circuit 120. Accordingly, it is possible to perform heat radiation in the through hole 32. Therefore, it is possible to prevent the heat generated from the drive circuit 120 and the inclined wiring 110 from staying in the through hole 32.

Of course, the disposition of the drive circuit 120 is not limited to the embodiment, but may be disposed on one side of the through hole 32 in the first direction X without departing from the scope of the invention. In addition, the number of the drive circuits 120 is not particularly limited.

Further, the configuration in which two connection terminal rows 94 are exposed to one through hole 32 is described, but is not limited. A configuration in which the through hole 32 is provided for each connection terminal row 94 so as to be connected to the inclined wiring 110 may be employed. In addition, the connection terminal row 94 is set to be two rows in accordance with the number of rows of the piezoelectric actuator 300; however, the connection terminal row 94 is not limited to the number of rows. The number of rows may be one or three or more.

Second Embodiment

In the embodiment, another aspect of a manufacturing method of forming the connection terminal 91 which is an example of the first wiring into the reverse trapezoid shape will be described. FIGS. 11A to 11D are cross-sectional views of a stacked wiring which is provided with a connection terminal and an inclined wiring. Meanwhile, like reference numerals are given to like elements of those in the first embodiment and description thereof is properly omitted.

Figure 11A:
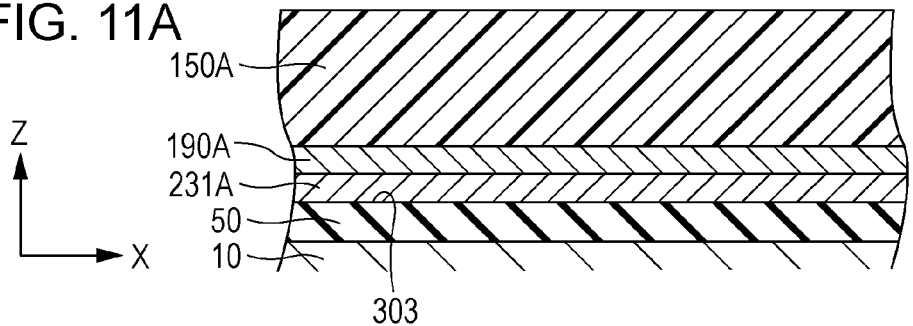
FIGS. 11A to 11D are cross-sectional views of stacked wirings according to a second embodiment.

As illustrated in FIG. 11A, the vibrating plate 50 is formed on the flow path forming substrate 10. A first layer 231A which is formed from, for example, nichrome, is formed the entire vibrating plate 50, that is, the third main surface 303, and a second layer 190A which is formed from, for example, gold, is formed on the first layer 231A. In addition, the resist pattern 150 is formed in the entire the second layer 190A.

Figure 11B:
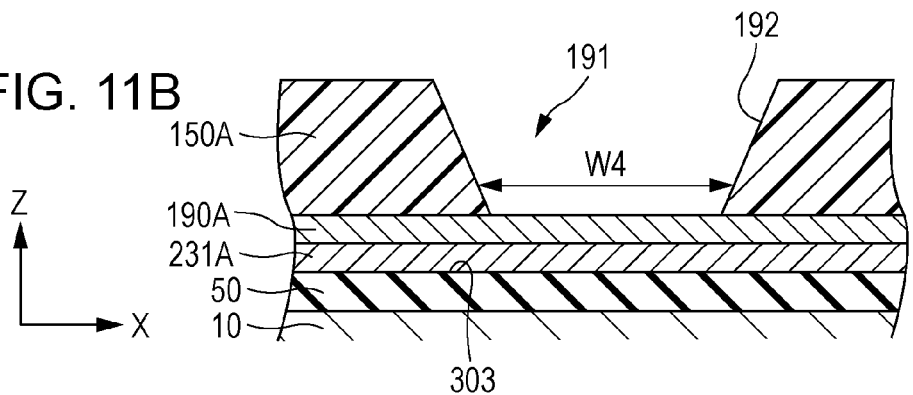

Next, as illustrated in FIG. 11B, an overexposure is performed by a negative resist through the photoresist method so as to expose the area corresponding to the connection terminal 91 (the lead electrode 90) of the second layer 190A. The overexposure referred to herein means performing exposure in the number of seconds greater than the number of seconds of the exposure of an appropriate exposure amount. The appropriate exposure amount means, for example, an exposure amount obtained as follows. When sintering a line drawing, with respect to the line width of a document to be penetrated, the line width formed from the conductive material which is obtained through an exposing and developing process calculates a range of the number of seconds of the exposure which is obtained in the same way and then the exposure is performed in the number of seconds in the center of the range.

Therefore, the opening portion 191 which is the through hole in which a portion of the second layer 190A penetrates in the direction Z is formed, and the second layer 190A is exposed to the bottom portion of the opening portion 191. The opening portion 191 is formed through the overexposure, and thus the side surface 192 of the opening portion 191 is inclined and the width W4 between the side surfaces 192 extends to the direction far from the second layer 190A.

Figure 11C:
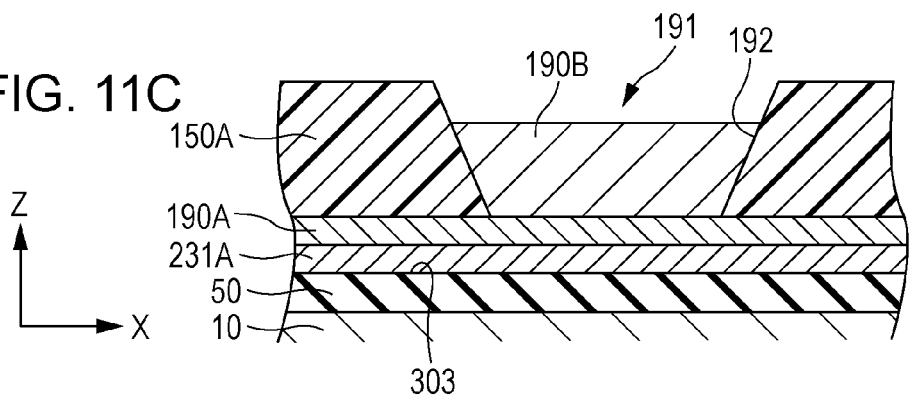

Next, as illustrated in FIG. 11C, the resist pattern 150A is set to the mask and a plating process is performed. Specifically, the same material as that of the second layer 190A, that is, a gold plating layer 190B, is formed in the opening portion 191 in the embodiment.

Figure 11D:
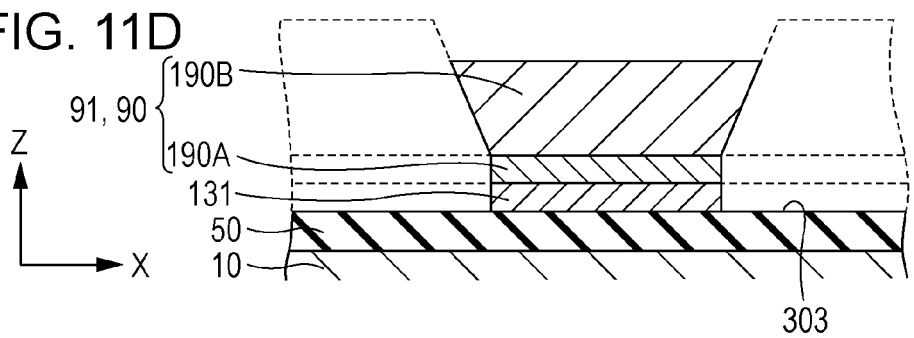

Next, as illustrated in FIG. 11D, by removing the resist pattern 150A and unnecessary portions of the second layer 190A and the first layer 231A, it is possible to form the connection terminal 91 (the lead electrode 90), which is formed into the reverse trapezoid shape and is configured to include the second layer 190A provided between the gold plating layer 190B and the first layer 231A and the gold plating layer 190B, on the first adhesion layer 131 (a layer in which unnecessary portions of the first layer 231A are removed).

Hereinafter, as described in the first embodiment, it is possible to manufacture the stacked wiring 130 by providing the inclined wiring 110 which is an example of the second wiring on the aforementioned connection terminal 91.

According to the method of forming the stacked wiring in the embodiment, it is possible to form the opening portion 191 through a photoresist method with high precision, and thus it is possible to form the connection terminal 91 formed of the gold plating layer 190B which is formed in the opening portion 191 with high precision.

Third Embodiment

Figure 12:
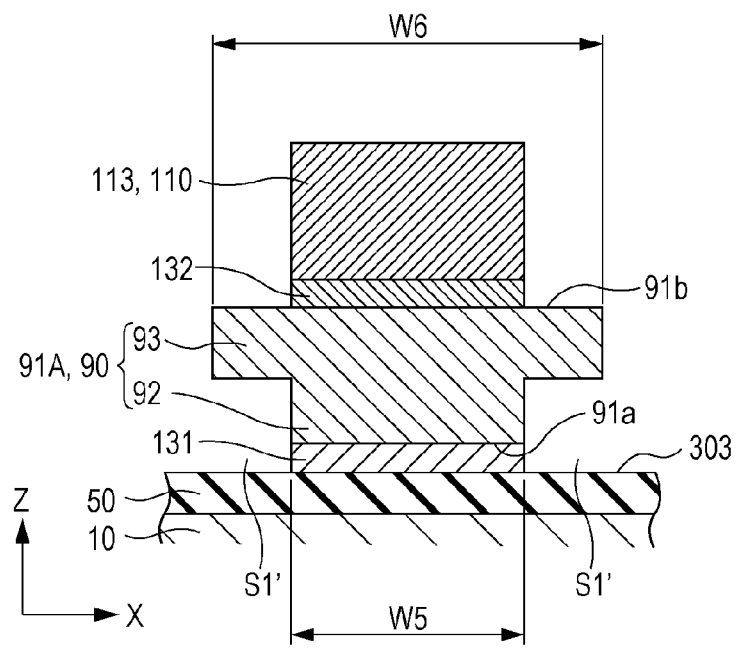
FIG. 12 is a cross-sectional view of stacked wirings according to a third embodiment.

The connection terminal 91 which is an example of the first wiring described in the first embodiment is formed into the reverse trapezoid shape; however, the shape of connection terminal 91 is not limited. FIG. 12 is a cross-sectional view of a stacked wiring which is perform with a connection terminal and an inclined wiring. Meanwhile, like reference numerals are given to elements like those of the first embodiment and description thereof is properly omitted.

In the cross-sectional shape of the connection terminal 91A according to the embodiment, there is provided a lower adhesion layer 92 of the first adhesion layer 131 and an upper adhesion layer 93 on the lower adhesion layer 92. The cross-sectional shape of the lower adhesion layer 92 is a rectangular shape and the cross-sectional shape of the upper adhesion layer 93 is also the rectangular shape. A width W6 of the upper adhesion layer 93 in the direction X is smaller than a width W5 of the lower adhesion layer 92 in direction X.

That is, the connection terminal 91A is not configured to gradually extend as the width of the cross-sectional shape in the direction X is far from the third main surface 303, but is configured to extend in the boundary between the lower adhesion layer 92 and the upper adhesion layer 93 in a step wise manner.

With such a configuration, in the connection terminal 91A, first space portions S1' which are both outer sides of the lower adhesion layer 92 in the direction X, and the lower side of the upper adhesion layer 93 in the direction Z (the third main surface 303) is formed. The first space portion S1' corresponds to the first space portion S1 of the first embodiment. That is, there is a tendency that the etchant remains in the first space portion S1' when performing the wet etching, and it is possible to decrease the etching rate due to the etchant in the first space portion S1' as in the first embodiment. In addition, similar to in the method of forming the stacked wiring according to the first embodiment, the first adhesion layer 131 is etched by the etchant and thus it is possible to suppress the peeling-off from the third main surface 303.

Other Embodiments

As above, embodiments of the invention are described; however, the basic configuration of the invention is not limited to the aforementioned embodiments.

For example, in the aforementioned first embodiment, the configuration in which the through hole 32 is provided on the protective substrate 30 and the first side wall portion 321 which is the inclined surface is provided in the through hole 32 is described; however, the configuration is not particularly limited. For example, without providing the through hole 32 in the protective substrate 30, two protective substrates 30 may be provided with a predetermined distance therebetween in the second direction Y, and the first side wall portion 321 which is the inclined surface in the surfaces facing each other in the second direction Y may be formed. With this configuration, it is possible to achieve the same effect as in the first embodiment.

In addition, in the aforementioned first embodiment, the linear portion 112a and the inclined portion 112b are provided as the inclined wiring portion 112; however, the inclined wiring portion 112 is not particularly limited. For example, only the inclined portion 112b may be provided without providing the linear portion 112a.

Of course, two or more of the linear portions 112a or two or more of the inclined portions 112b may be provided with respect to one inclined wiring portion 112, and the plurality of inclined portions 112b which have different inclination angles from each other may be provided with respect to one inclined wiring portion 112.

Further, in the aforementioned first embodiment, the configuration in which the drive circuit 120 is mounted on the protective substrate 30 is exemplified; however, the configuration is not particularly limited. For example, the drive circuit 120 may be mounted on the flexible substrate or the like, and the flexible substrate may be electrically connected to the wiring terminal 114 of the protective substrate 30.

In addition, in the above-described embodiments, the thin film-type piezoelectric actuator 300 is described as the pressure generating unit which causes the pressure change to the pressure generating chamber 12; however, the pressure generating unit is not particularly limited to the thin film-type piezoelectric actuator 300. For example, it is possible to use a thick film-type piezoelectric actuator which is formed by a method of attaching a green sheet, and a longitudinal vibration-type piezoelectric actuator which causes a piezoelectric material and an electrode forming material to be stacked to each other and to extend in the axial direction. In addition, as the pressure generating unit, it is possible to use, for example, an actuator which causes the heat generating element to be disposed in the pressure generating chamber and causes the liquid droplets to be ejected from the nozzle opening by bubbles generated due to the heat generation of the heat generating element, and a so-called electrostatic type actuator which causes static electricity between the vibrating plate and the electrode, causes the vibrating plate to be deformed by an electrostatic force, and causes the liquid droplets to be ejected from the nozzle opening.

Figure 13:
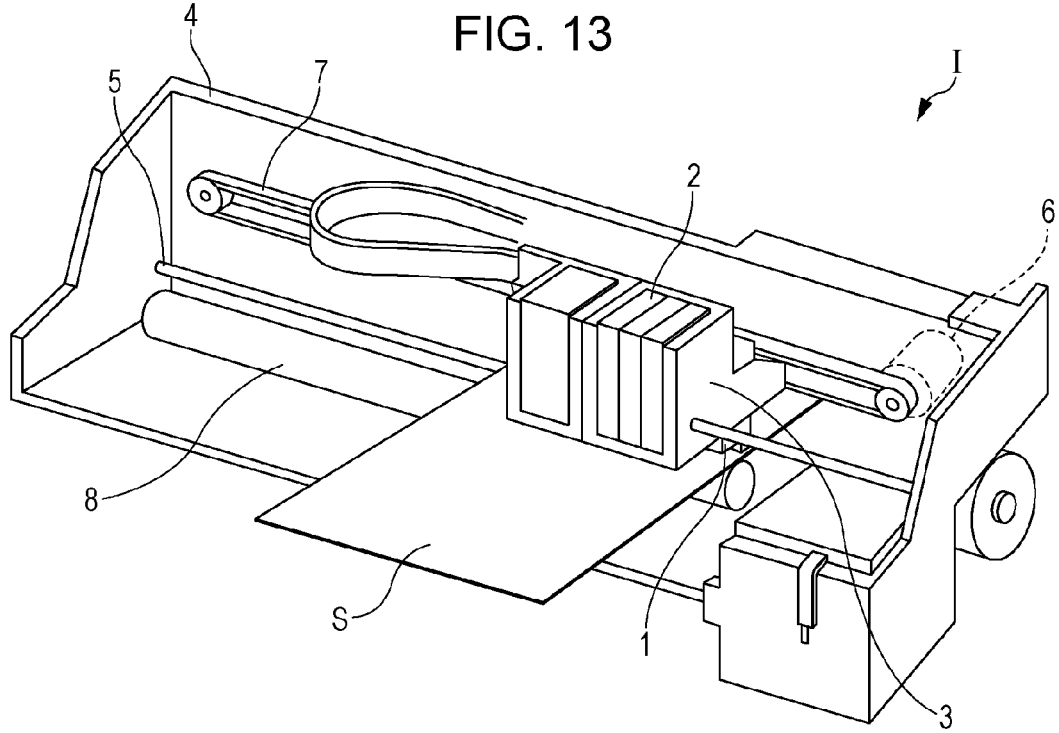
FIG. 13 is a schematic perspective view of an ink jet recording apparatus.

In addition, the recording head 1 according to the embodiments configures a part of a recording head unit which is provided with an ink flow path communicating with an ink cartridge or the like and is mounted on an ink jet recording apparatus. FIG. 13 is a schematic view showing an example of the ink jet recording apparatus.

In an ink jet recording apparatus I, the cartridge 2 which configures the ink supply unit is detachably provided in recording head 1, and a carriage 3 on which the recording head 1 is mounted is provided at a carriage shaft 5 attached to an apparatus main body 4 so as to be movable in an axial direction (main scanning direction).

In addition, the carriage 3 on which the recording head 1 is mounted is moved along the carriage shaft 5 by delivering drive force from the drive motor 6 to the carriage 3 via a plurality of gears (not shown) and a timing belt 7. In contrast, a transport roller 8 as a transport mechanism is provided at the apparatus main body 4, and a recording sheet S as a recording medium such as a paper is transported by the transport roller 8. In addition, the transport mechanism for transporting the recording sheet S is not limited to the transport roller, and a belt, a drum, or the like may be used instead.

Meanwhile, in the aforementioned ink jet recording apparatus I, the configuration in which the recording head 1 is mounted on the carriage 3 and then moved to the main scanning direction is exemplified; however, the aforementioned ink jet recording apparatus I is not particularly limited to the configuration. For example, it is possible to apply the invention to a so-called line-type recording apparatus which performs printing by only moving the recording sheet S such as paper to the sub scanning direction while the recording head 1 is fixed.

In addition, in the above described examples, the ink jet recording apparatus I is configured such that the cartridge 2 which is the liquid storage unit is mounted on the carriage 3; however, the configuration is not limited. For example, a liquid storage unit such as an ink tank may be fixed to the apparatus main body 4 and the liquid storage unit and the recording head 1 may be connected to each other via a tube or the like. In addition, the liquid storage unit may not be mounted to the ink jet recording apparatus.

Further, the invention is broadly intended for the general liquid ejecting head, and for example, it is also possible to apply the present invention to color material ejecting heads that are used in the production of color filters such as liquid crystal displays, electrode material ejecting heads that are used in electrode formation such as organic EL (Electro Luminescence) displays, FED (Field Emission Displays) and the like, organic material ejecting heads that are used in the production of biochips, and the like.

Further, the invention is widely directed to the general wiring mounting structure, and can be applied to devices other than the liquid ejecting head.

The entire disclosure of Japanese Patent Application No. 2014-043606, filed Mar. 6, 2014 is expressly incorporated by reference herein.

What is claimed is:

1. A method of forming a stacked wiring comprising:
   forming a first adhesion layer on a substrate;
   forming a first wiring on the first adhesion layer;
   etching the first adhesion layer and the first wiring in a same first wet etching step so that the first wiring is in a reverse trapezoid shape in which a first width of a top surface is larger than a second width of a bottom surface contacting the first adhesion layer as seen in a cross-section direction intersecting with a first wiring extending direction;
   covering the top surface and a side surface of the first wiring with a second adhesion layer;
   forming a second wiring on the second adhesion layer; and
   etching the second adhesion layer and the second wiring in a same second wet etching step so that the second adhesion layer and the second wiring only remain on the top surface of the first wiring,
   wherein the first and second adhesion layers are formed of nichrome, and the first and second wirings are formed of gold.

2. The method of forming a stacked wiring according to claim 1,
   wherein the reverse trapezoid shape is obtained by:
   forming a resist layer on the first wiring, and
   over-etching the first wiring and the first adhesion layer in the same first wet etching step.

3. A method of forming a stacked wiring comprising:
   forming a first adhesion layer on a substrate;
   forming a first wiring on the first adhesion layer;
   forming a resist pattern on the first wiring, the resist pattern having a through hole with an opening size that increases from the first wiring toward a top of the resist pattern;
   forming a plating layer in the opening by a plating method so that the plating layer is formed on the first wiring;
   etching the resist pattern, the first adhesion layer and the first wiring so that the plating layer is in a reverse trapezoid shape in which a first width of a top surface is larger than a second width of a bottom surface contacting the first wiring as seen in a cross-section direction intersecting with a first wiring extending direction;
   covering the top surface and a side surface of the plating layer with a second adhesion layer;
   forming a second wiring on the second adhesion layer; and
   etching the second adhesion layer and the second wiring in a same wet etching step so that the second adhesion layer and the second wiring only remain on the top surface of the plating layer,
   wherein the first and second adhesion layers are formed of nichrome, and the first and second wirings and the plating layer are formed of gold.

* * * * *